United States Patent
Lee et al.

(10) Patent No.: US 11,489,063 B2
(45) Date of Patent: Nov. 1, 2022

(54) METHOD OF MANUFACTURING A SOURCE/DRAIN FEATURE IN A MULTI-GATE SEMICONDUCTOR STRUCTURE

(71) Applicant: Taiwan Semiconductor Manufacturing Co., Ltd., Hsin-Chu (TW)

(72) Inventors: Wei Ju Lee, Hsinchu (TW); Chun-Fu Cheng, Hsinchu County (TW); Chung-Wei Wu, Hsin-Chu County (TW); Zhiqiang Wu, Hsinchu County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 19 days.

(21) Appl. No.: 16/931,930

(22) Filed: Jul. 17, 2020

(65) Prior Publication Data
US 2021/0066477 A1      Mar. 4, 2021

Related U.S. Application Data

(60) Provisional application No. 62/894,291, filed on Aug. 30, 2019.

(51) Int. Cl.
*H01L 29/66* (2006.01)
*H01L 29/78* (2006.01)
(Continued)

(52) U.S. Cl.
CPC .. *H01L 29/66795* (2013.01); *H01L 21/02236* (2013.01); *H01L 21/02532* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 8,836,016 B2    9/2014  Wu et al.
8,841,701 B2    9/2014  Lin et al.
(Continued)

*Primary Examiner* — Younes Boulghassoul
(74) *Attorney, Agent, or Firm* — Haynes and Boone, LLP

(57) ABSTRACT

The present disclosure provides a method of manufacturing a semiconductor device. The method includes forming a fin structure in which first semiconductor layers and second semiconductor layers are alternately stacked; forming a sacrificial gate structure over the fin structure; etching a source/drain region of the fin structure, which is not covered by the sacrificial gate structure, thereby forming a source/drain trench; laterally etching the first semiconductor layers through the source/drain trench; forming an inner spacer layer, in the source/drain trench, at least on lateral ends of the etched first semiconductor layers; forming a seeding layer on the inner spacer layer; and growing a source/drain epitaxial layer in the source/drain trench, wherein the growing of the source/drain epitaxial layer includes growing the source/drain epitaxial layer from the seeding layer.

20 Claims, 24 Drawing Sheets

(51) Int. Cl.
*H01L 21/8234* (2006.01)
*H01L 21/02* (2006.01)
*H01L 29/08* (2006.01)
*H01L 27/088* (2006.01)
*H01L 29/786* (2006.01)
*H01L 29/423* (2006.01)
*H01L 29/06* (2006.01)

(52) U.S. Cl.
CPC ............ *H01L 21/823418* (2013.01); *H01L 21/823431* (2013.01); *H01L 21/823468* (2013.01); *H01L 27/0886* (2013.01); *H01L 29/0673* (2013.01); *H01L 29/0847* (2013.01); *H01L 29/42392* (2013.01); *H01L 29/6653* (2013.01); *H01L 29/66545* (2013.01); *H01L 29/66553* (2013.01); *H01L 29/66636* (2013.01); *H01L 29/7851* (2013.01); *H01L 29/78696* (2013.01); *H01L 29/0653* (2013.01); *H01L 29/6656* (2013.01)

(58) Field of Classification Search
CPC ........... H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 29/66553; H01L 29/6653; H01L 29/6656; H01L 29/0653; H01L 21/823468; H01L 21/823864; H01L 29/0847; H01L 29/66636; H01L 29/78618; H01L 21/823418; H01L 29/7848; H01L 21/823814

See application file for complete search history.

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 12/2017 | Wu et al. |
| 2019/0067490 A1* | 2/2019 | Yang ................ H01L 29/161 |
| 2019/0198616 A1* | 6/2019 | Coquand .......... H01L 29/41725 |
| 2020/0027959 A1* | 1/2020 | Cheng ............... H01L 29/66469 |
| 2020/0266060 A1* | 8/2020 | Cheng ............... H01L 29/0653 |
| 2020/0287021 A1* | 9/2020 | Wu .................. H01L 21/02126 |
| 2020/0395446 A1* | 12/2020 | Yi ..................... H01L 29/0847 |
| 2021/0028297 A1* | 1/2021 | Yao .................. H01L 29/1037 |

* cited by examiner

METHOD OF MANUFACTURING A SOURCE/DRAIN FEATURE IN A MULTI-GATE SEMICONDUCTOR STRUCTURE

PRIORITY DATA

This application claims priority to U.S. Provisional Patent Application Ser. No. 62/894,291 filed on Aug. 30, 2019, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Recently, multi-gate devices have been introduced in an effort to improve gate control by increasing gate-channel coupling, reduce OFF-state current, and reduce short-channel effects (SCEs). One such multi-gate device that has been introduced is the gate-all-around field effect transistor (GAA FET). The GAA FET device gets its name from the gate structure which can extend around the channel region providing access to the channel on two or four sides. GAA FET devices are compatible with conventional complementary metal-oxide-semiconductor (CMOS) processes and their structure allows them to be aggressively scaled while maintaining gate control and mitigating SCEs. GAA FET devices provide a channel in a stacked nanosheet configuration. Integration of GAA features around stacked nanosheets can be challenging. For example, in a stacked nanosheet GAA process flow, inner spacer layer formation can be an important process to reduce capacitance and prevent leakage between gate stacks and source/drain (S/D) regions. However, the inner spacer layer may cause difficulties in subsequent S/D epitaxial feature formation, such as voids or other interior defects during epitaxial growth, because of limited available semiconductor seed area. Therefore, while the current methods have been satisfactory in many respects, challenges with respect to performance of the resulting device may not be satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
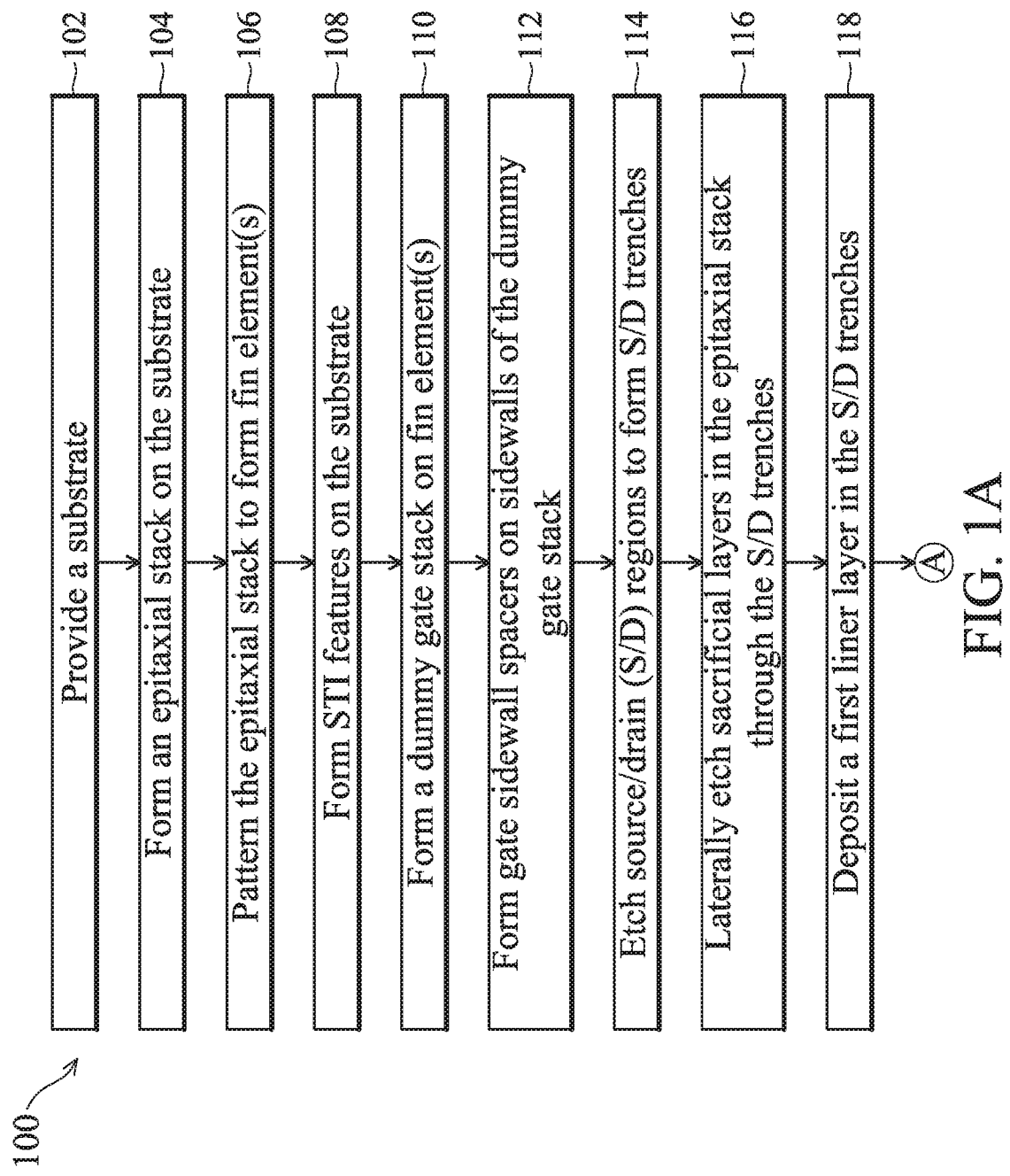
FIGS. 1A and 1B show a flow chart of a method for forming a multi-gate device including inner-spacer features, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating gate-all-around field effect transistor (GAA FET) devices with a semiconductor seed layer deposited on an inner spacer layer, which facilitates later-on formations of source/drain (S/D) epitaxial features.

A GAA FET device is a type of multi-gate device. Multi-gate devices include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FINFET, on account of their fin-like structure. As a type of multi-gate device, a GAA FET device includes any FET device that has its gate structure, or portion thereof, formed on 4-sides of a channel region (e.g., surrounding a portion of a channel region). Devices presented herein also include embodiments that have channel regions disposed in nanowire channel(s), bar-shaped channel(s), and/or other suitable channel configuration. Presented herein are embodiments of devices that may have one or more channel regions (e.g., nanowires) associated with a single, contiguous gate structure. However, one of ordinary skill would recognize that the teaching can apply to a single channel (e.g., single nanowire) or any number of channels. One of ordinary skill may recognize other examples of semiconductor devices that may benefit from aspects of the present disclosure.

Figure 1B:
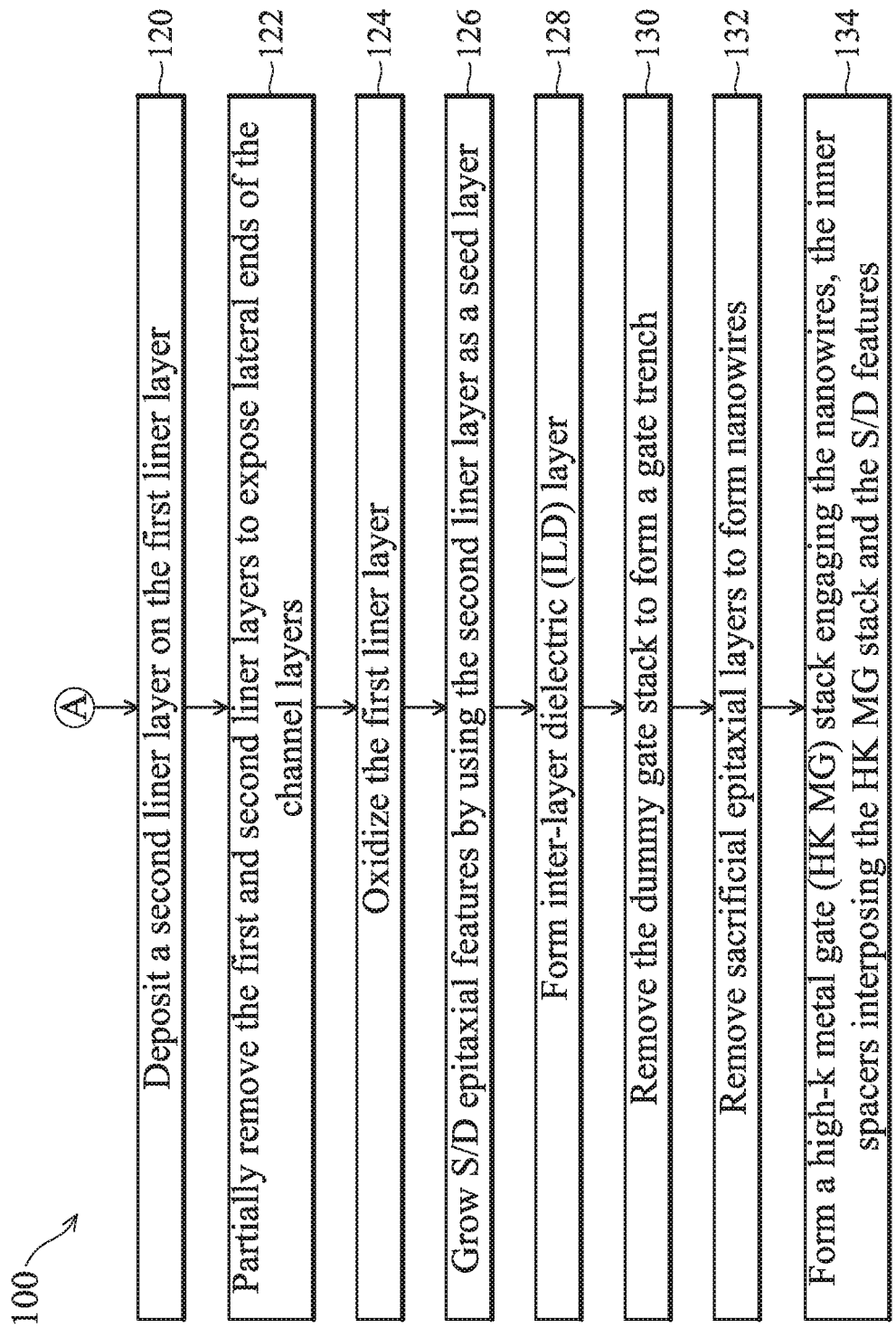

Illustrated in FIGS. 1A and 1B is a method 100 of semiconductor fabrication including fabrication of multi-gate devices. It is understood that additional operations can be provided before, during, and after processes shown by FIGS. 1A and 1B, and some of the operations described below can be replaced or eliminated, for additional embodiments of the method. The order of the operations/processes may be interchangeable. As used herein, the term "multi-gate device" is used to describe a device (e.g., a semiconductor transistor) that has at least some gate material disposed on multiple sides of at least one channel of the device. In some examples, the multi-gate device may be referred to as a GAA FET device or a nanosheet device having gate material disposed on at least four sides of at least one channel of the device. The channel region may be referred to as a "nanowire," which as used herein includes channel regions of various geometries (e.g., cylindrical, bar-shaped) and various dimensions.

The method 100 is described below with references to FIGS. 1A and 1B, in conjunction with FIGS. 2-22. FIGS. 2, 3, 4, 5, 6, 7, 8, 9, 10A, 19, 20, 21, and 22 are perspective views of an embodiment of a GAA FET device according to various stages of the method 100 of FIGS. 1A and 1B. FIGS. 10B, 11, 12, 13, 14, 15, 16, 17, and 18 are corresponding cross-sectional views of an embodiment of the GAA FET device along a cut (e.g., cut X1-X1 in FIG. 10A), which is along a lengthwise direction of the channel and perpendicular to a top surface of the substrate.

Figure 2:
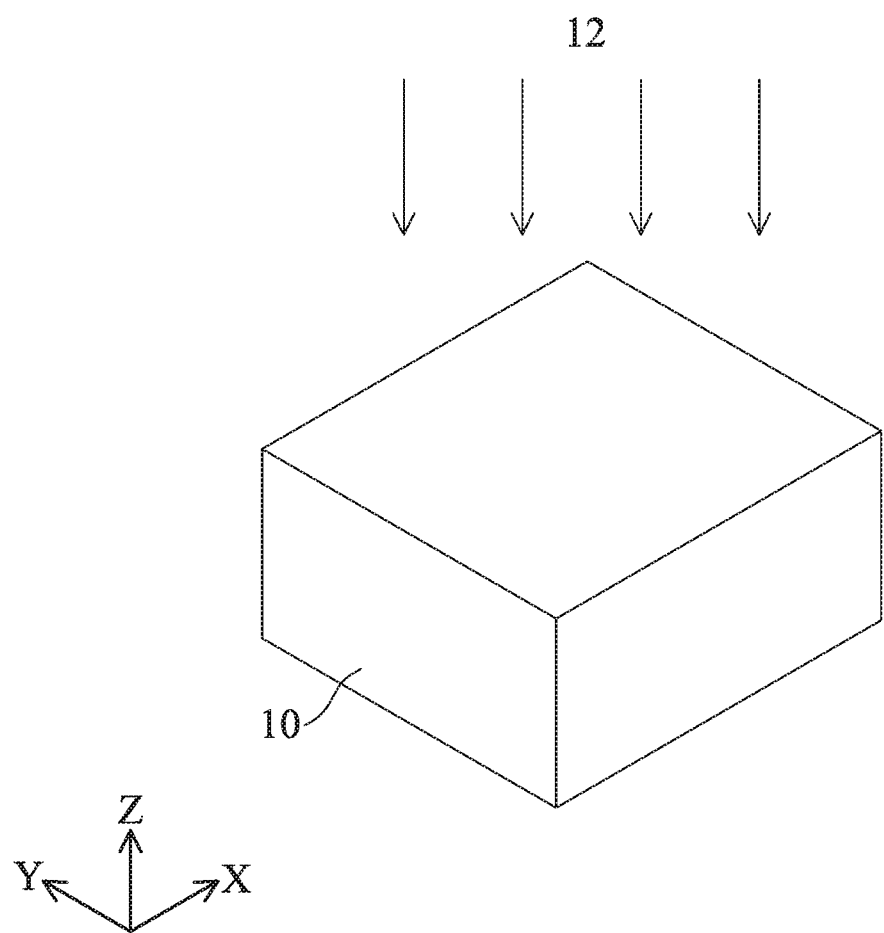
FIGS. 2, 3, 4, 5, 6, 7, 8, 9, 10A, 19, 20, 21, and 22 illustrate perspective views of a semiconductor structure during a fabrication process according to the method of FIGS. 1A and 1B, according to aspects of the present disclosure.

Referring to FIGS. 1A and 2, the method 100 begins at operation 102 where a substrate 10 is provided. The substrate 10 may include various regions that have been suitably doped with impurities (e.g., p-type or n-type conductivity). In some embodiments, impurity ions (dopants) 12 are implanted into a silicon substrate to form a well region. The ion implantation is performed to prevent a punch-through effect. The dopants 12 are, for example boron (B) for an n-type FinFET or phosphorus (P) for a p-type FinFET.

In some embodiments, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In the illustrated embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on bulk silicon. The germanium concentration of the SiGe buffer layers may increase from 30 atomic % germanium for the bottom-most buffer layer to 70 atomic % germanium for the top-most buffer layer.

Figure 3:
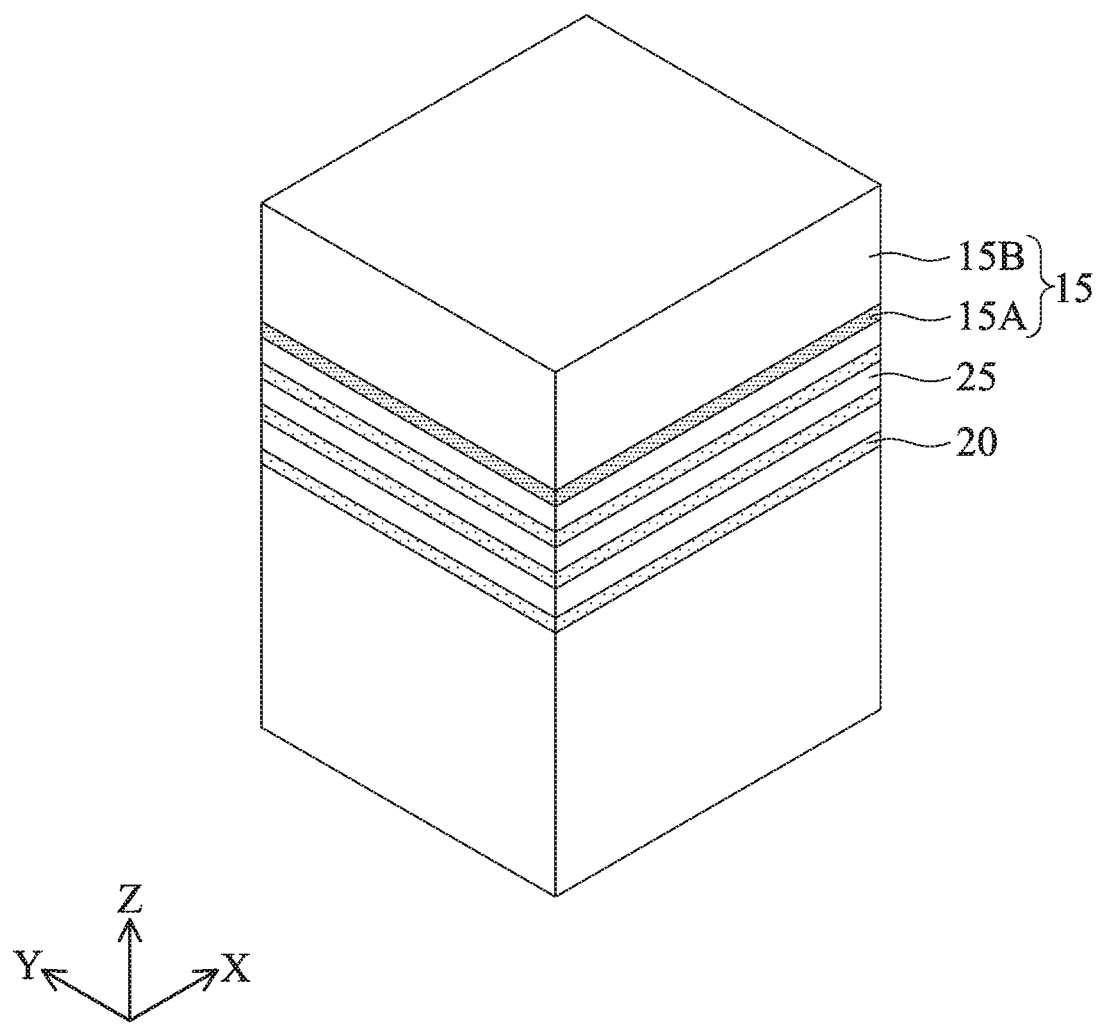

Referring to FIGS. 1A and 3, the method 100 then proceeds to operation 104 where stacked semiconductor layers are formed over the substrate 10. The stacked semiconductor layers include first semiconductor layers 20 and second semiconductor layers 25. Further, a mask layer 15 is formed over the stacked layers. By way of example, the stacked semiconductor layers may be epitaxially grown by a molecular beam epitaxy (MBE) process, a metalorganic chemical vapor deposition (MOCVD) process, and/or other suitable epitaxial growth processes.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 20 and the second semiconductor layers 25 are made of Si, a Si compound, SiGe, Ge or a Ge compound. However, other embodiments are possible including those that provide for a first composition and a second composition having different oxidation rates and/or etch selectivity. In at least some examples, the first semiconductor layers 20 include an epitaxially grown SiGe layer and the second semiconductor layers 25 include an epitaxially grown Si layer. The Si oxidation rate of the second semiconductor layers 25 is less than the SiGe oxidation rate of the first semiconductor layers 20. In one example, the first semiconductor layers 20 are $Si_{1-x}Ge_x$, where x is less than about 0.3, such as in a range from about 0.15 to about 0.25. In some embodiments, the first semiconductor layers 20 and the second semiconductor layers 25 are substantially dopant-free (i.e., having an extrinsic dopant concentration from about 0 $cm^{-3}$ to about $1\times10^{17}$ $cm^{-3}$), where for example, no intentional doping is performed during the epitaxial growth process.

The second semiconductor layers 25 or portions thereof may form nanosheet channel(s) of the GAA FET device. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the second semiconductor layers 25 to define a channel or channels of a device is further discussed below. Accordingly, the second semiconductor layers 25 are also referred to as the channel layers 25, while the first semiconductor layers 20 are also referred to as the sacrificial layers 20.

In FIG. 3, three layers of the first semiconductor layer 20 and three layers of the second semiconductor layer 25 are disposed. However, the number of the layers are not limited to three, and may be as small as one (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, such as in a range from about 3 nm to about 50 nm in some embodiments, or in a range from about 5 nm to about 15 nm in other embodiments. The thickness of the second semiconductor layers 25 is in a range from about 3 nm to about 30 nm in some embodiments, or in a range from about 5 nm to about 15 nm in other embodiments. The thickness of each of the first semiconductor layers 20 may be the same or may vary. In some embodiments, the bottom-most semiconductor layer 20 (the closest layer to the substrate 10) is thicker than the upper semiconductor layers. The thickness of the bottommost semiconductor layer is in a range from about 10 nm to about 50 nm in some embodiments, or in a range from 20 nm to 40 nm in other embodiments.

In some embodiments, the mask layer 15 includes a first mask layer 15A and a second mask layer 15B. The first mask layer 15A is a pad oxide layer made of silicon oxide, which can be formed by a thermal oxidation process. The second mask layer 15B is made of silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo-lithography and etching.

Figure 4:
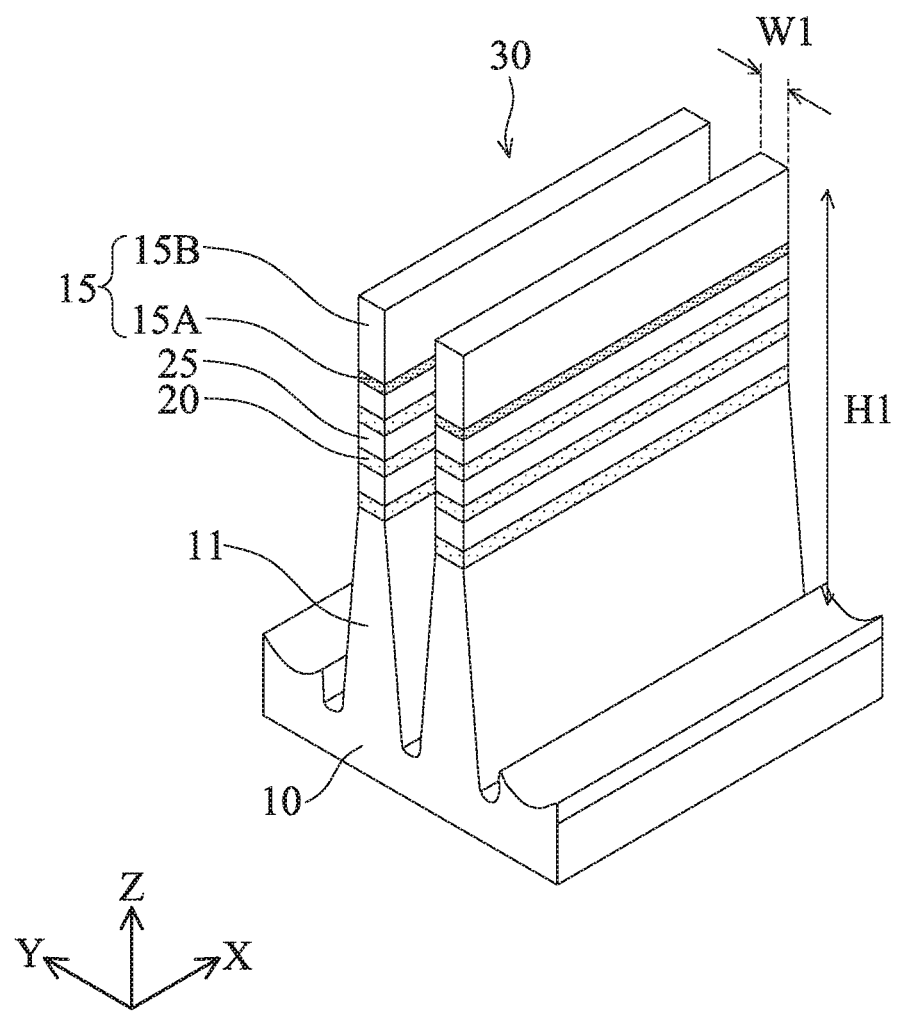

Referring to FIGS. 1A and 4, the method 100 then proceeds to operation 106 where fin elements (also referred to as fins) 30 are formed by patterning the stacked semiconductor layers 20 and 25 by using the patterned mask layer 15. With reference to the example of FIG. 4, in an embodiment of operation 106, a plurality of fins 30 extending from the substrate 10 are formed extending in the X direction. In various embodiments, each of the fins 30 includes upper portions constituted by the stacked semiconductor layers 20 and 25, and well portions 11 formed from the substrate 10. The width W1 of the upper portion of the fin structure along the Y direction is in a range from about 10 nm to about 40 nm in some embodiments, or in a range from about 20 nm to about 30 nm in other embodiments. The height H1 along the Z direction of the fin structure is in a range from about 100 nm to about 200 nm in some embodiments.

The fins 30 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 30 by etching initial stacked semiconductor layers 20 and 25. The etching process can include dry etching, wet etching, reactive ion etching (RIE), and/or other suitable processes.

In FIG. 4, two fins 30 are arranged in the Y direction. But the number of the fins 30 is not limited to and may be as small as one or three or more. In some embodiments, one or more dummy fin structures are formed on both sides of the fins 30 to improve pattern fidelity in the patterning operations.

Figure 5:
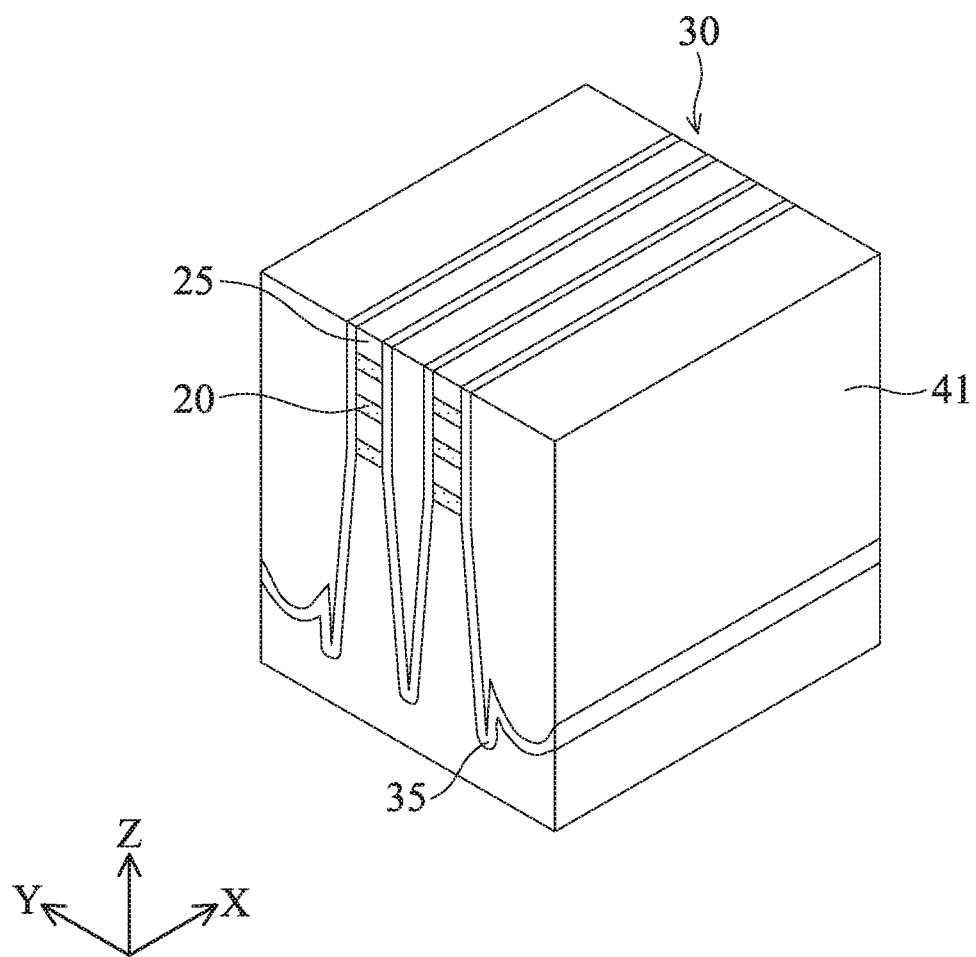
Figure 6:
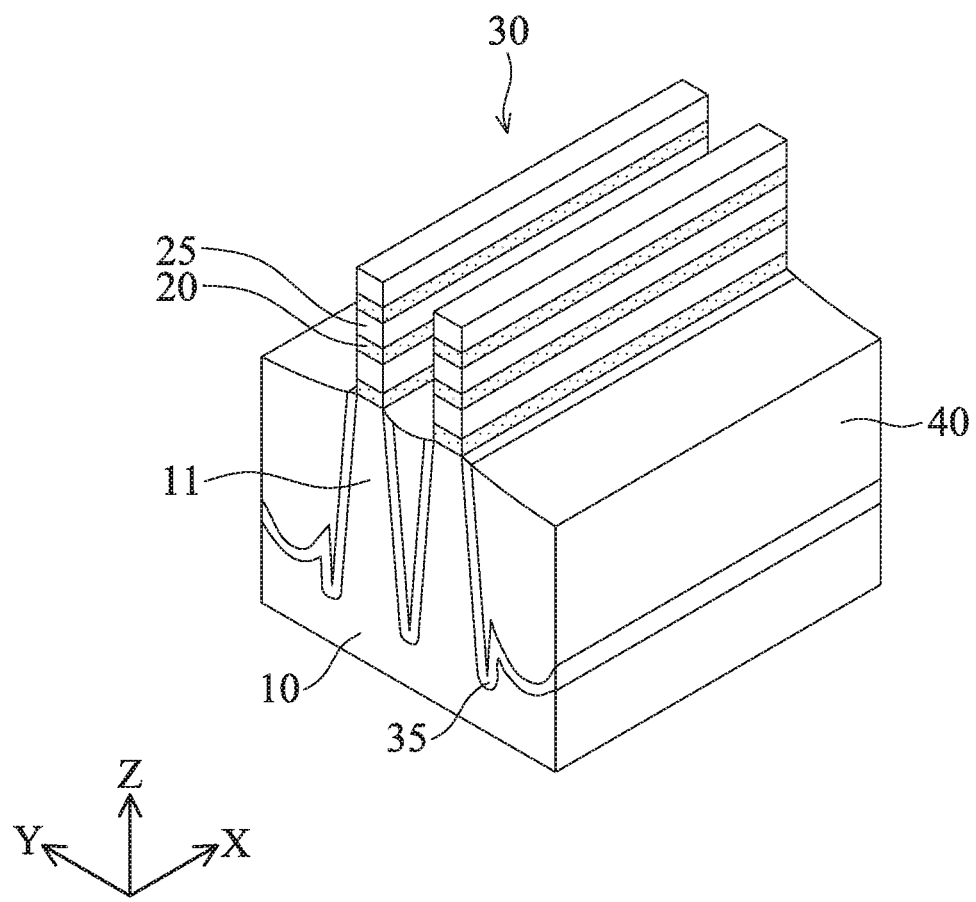

Referring to FIGS. 1A, 5, and 6, method 100 proceeds to operation 108 by forming a shallow trench isolation (STI) feature interposing the fins 30. By way of example, an insulating material layer 41 including one or more layers of insulating material is formed over the substrate so that the fin structures are fully embedded in the insulating material layer 41. The insulating material for the insulating material layer 41 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating material layer 41. Then, a planarization operation, such as a chemical mechanical polishing (CMP) method and/or an etch-back method, is performed such that the upper surface of the topmost second semiconductor layer 25 is exposed from the insulating material layer 41 as shown in FIG. 5.

In some embodiments, a liner layer 35 is formed over the structure of FIG. 4 before forming the insulating material layer 41, as shown FIG. 5. In some embodiments, the liner layer 35 is made of SiN or a silicon nitride-based material (e.g., SiON, SiCN or SiOCN). Then, as shown in FIG. 6, the insulating material layer 41 is recessed to form an isolation feature 40 so that the upper portions of the fins 30 are exposed. With this operation, the fins 30 are electrically separated from each other by the isolation feature 40, which is also referred to as a shallow trench isolation (STI) 40.

Figure 7:
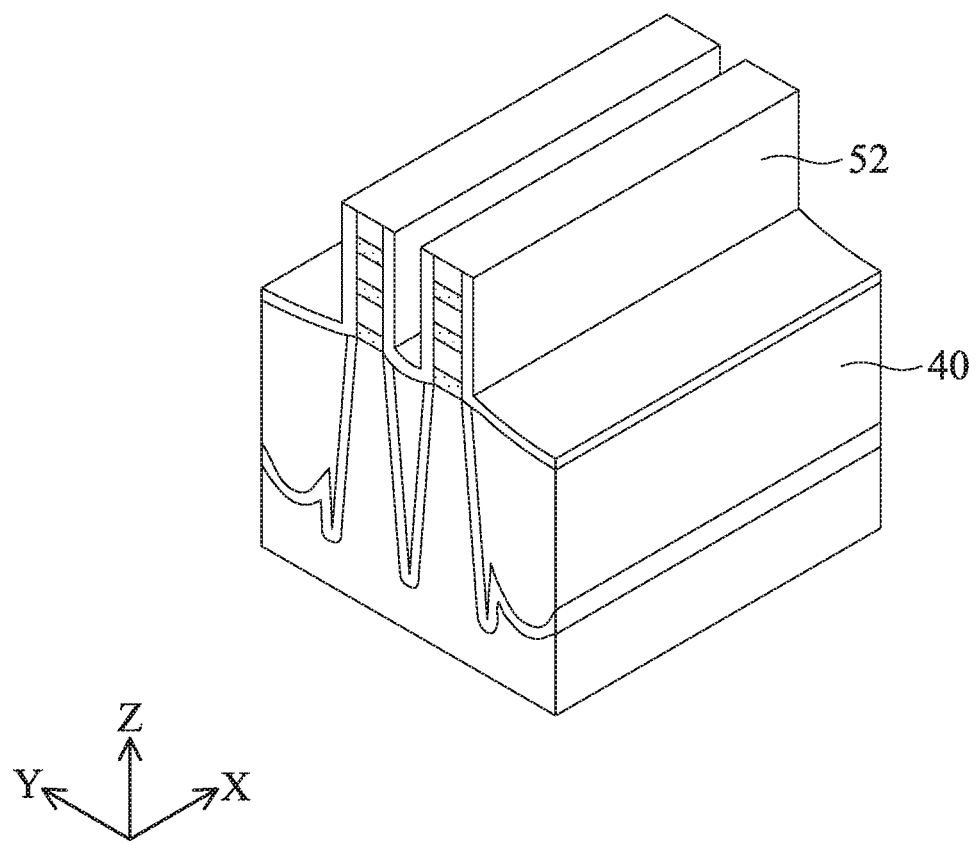
Figure 8:
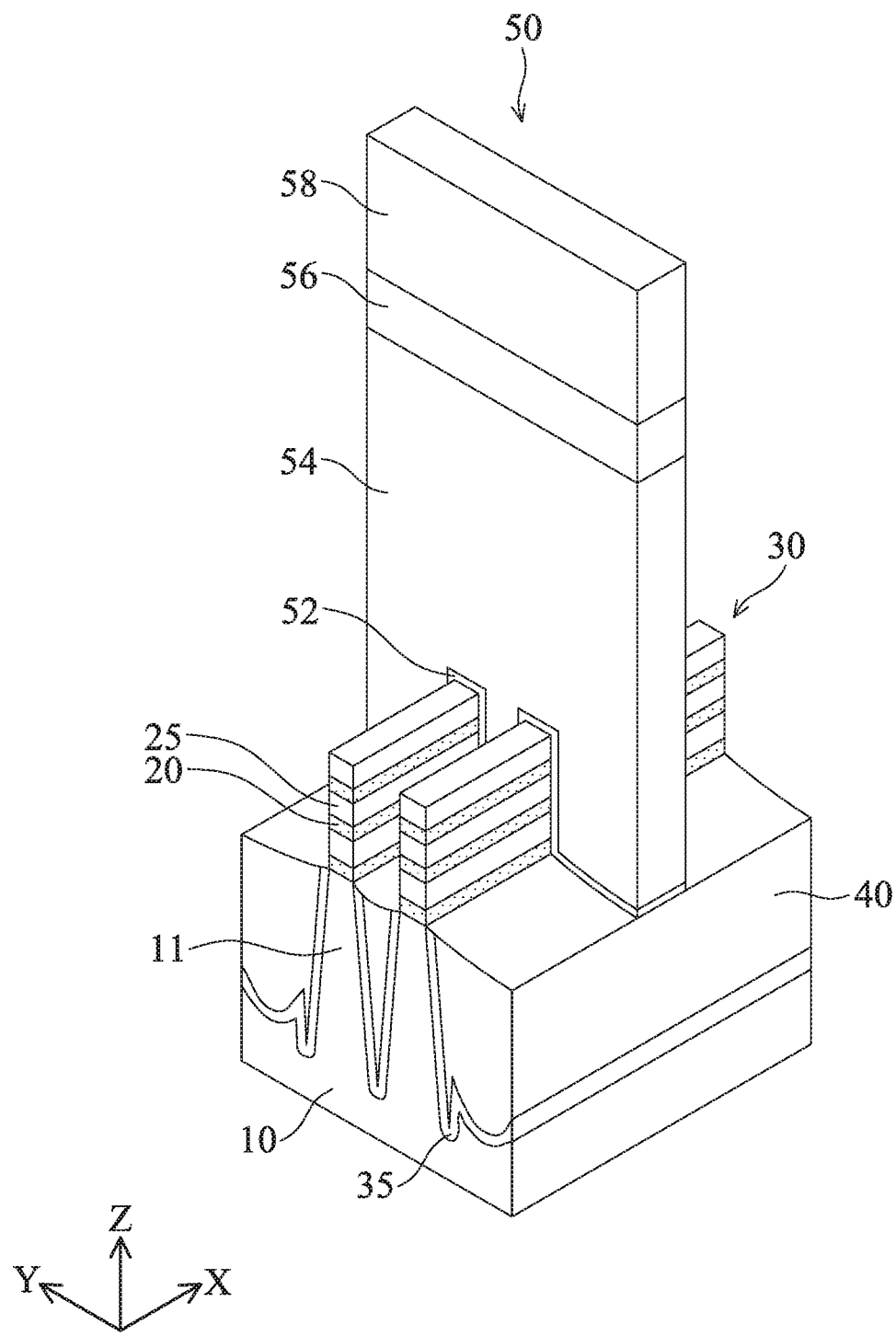

Referring to FIGS. 1A, 7, and 8, method 100 proceeds to operation 110 where sacrificial layers/features are formed and in particular, a dummy gate structure. While the present discussion is directed to a replacement gate process whereby a dummy gate structure is formed and subsequently replaced, other configurations may be possible. With reference to FIG. 7, after the STI 40 is formed, a sacrificial gate dielectric layer 52 is formed. The sacrificial gate dielectric layer 52 includes one or more layers of insulating material, such as a silicon oxide-based material. In one embodiment, silicon oxide formed by CVD is used. The thickness of the sacrificial gate dielectric layer 52 is in a range from about 1 nm to about 5 nm in some embodiments.

FIG. 8 illustrates a structure after a sacrificial gate structure 50 is formed over the exposed fins 30. The sacrificial gate structure 50 includes the sacrificial gate dielectric layer 52 and a sacrificial gate electrode 54. The sacrificial gate structure 50 is formed over a portion of the fins 30 which is to be a channel region. The sacrificial gate structure defines the channel region of the GAA FET device.

The sacrificial gate structure 50 is formed by first blanket depositing the sacrificial gate dielectric layer 52 over the fins 30. A sacrificial gate electrode layer is then blanket deposited on the sacrificial gate dielectric layer 52 and over the fins 30, such that the fins 30 are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 56 and a silicon oxide mask layer 58.

Next, a patterning operation is performed on the mask layer and sacrificial gate electrode layer is patterned into the sacrificial gate structure 50, as shown in FIG. 8. The sacrificial gate structure includes the sacrificial gate dielectric layer 52, the sacrificial gate electrode 54 (e.g., poly silicon), the pad SiN layer 56 and the silicon oxide mask layer 58. By patterning the sacrificial gate structure, the stacked semiconductor layers 20 and 25 are partially exposed on opposite sides of the sacrificial gate structure 50, thereby defining source/drain (S/D) regions. In this disclosure, a source and a drain are interchangeably used and the structures thereof are substantially the same. In FIG. 8, one sacrificial gate structure 50 is formed, but the number of the sacrificial gate structures 50 is not limited to one, two, or more sacrificial gate structures, which are arranged in the X direction in some embodiments. In certain embodiments, one or more dummy sacrificial gate structures are formed on both sides of the sacrificial gate structures to improve pattern fidelity.

Figure 9:
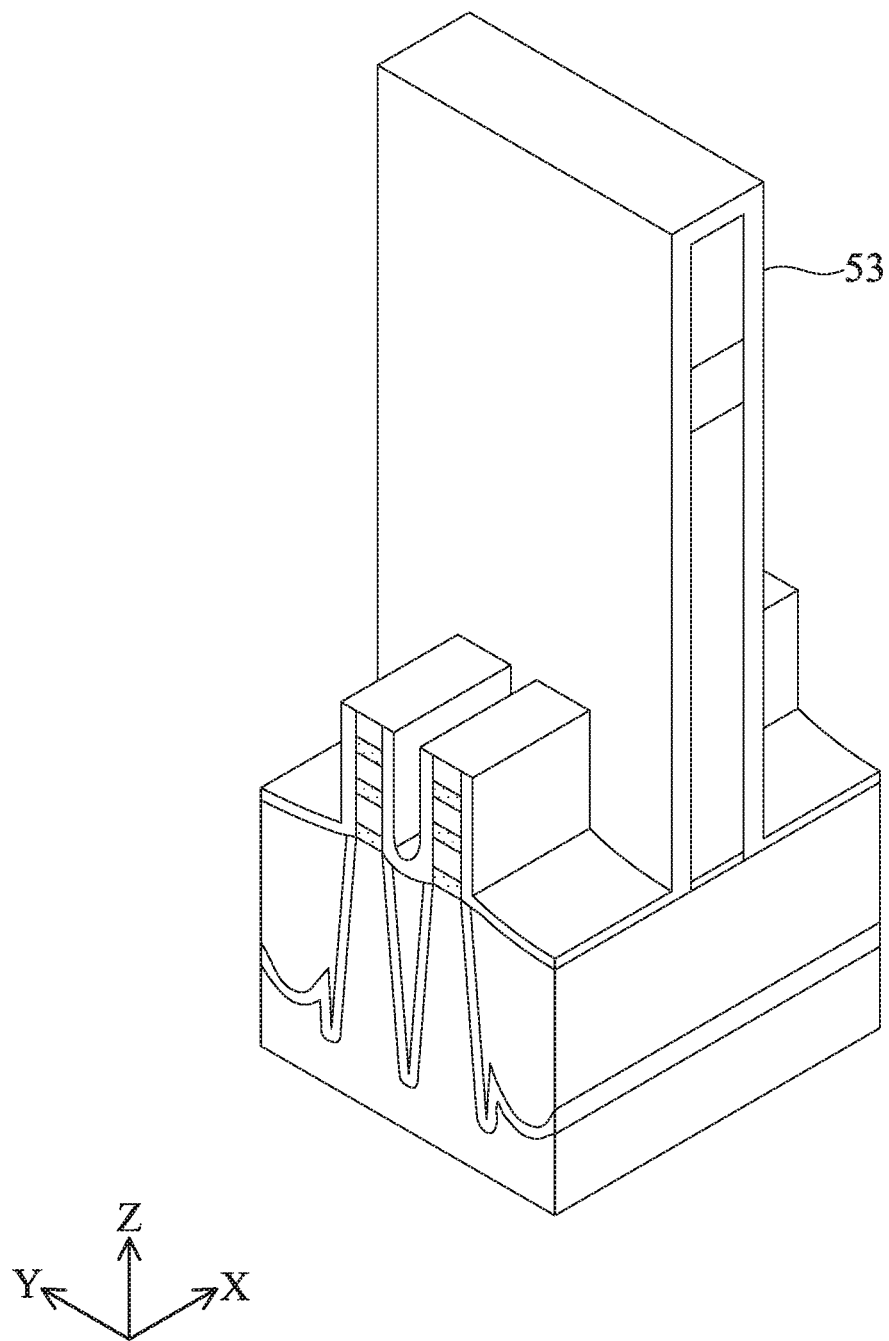

Referring to FIGS. 1A and 9, method 100 then proceeds to operation 112 where gate sidewall spacers are formed. After the sacrificial gate structure 50 is formed, a blanket layer 53 of an insulating material for forming gate sidewall spacers 55 (FIG. 10A) is conformally deposited by using CVD or other suitable methods. The blanket layer 53 is deposited in a conformal manner so that it is formed to have substantially equal thicknesses on vertical surfaces, such as the sidewalls, horizontal surfaces, and the top of the sacrificial gate structure. In some embodiments, the blanket layer 53 is deposited to a thickness in a range from about 2 nm to about 8 nm. In one embodiment, the insulating material of the blanket layer 53 is a silicon nitride-based material, such as SiN, SiON, SiOCN or SiCN and combinations thereof.

Figure 10A:
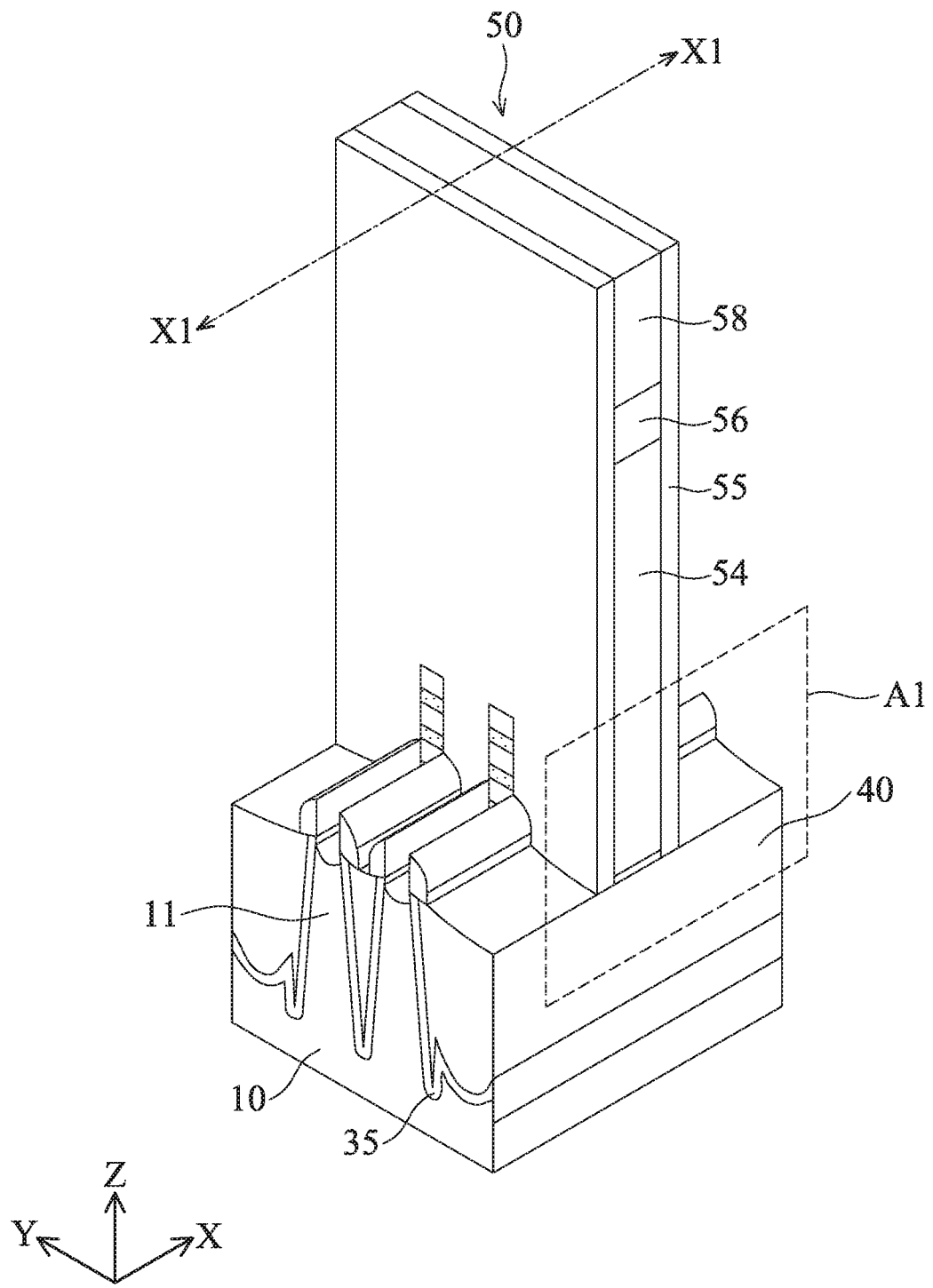

After the blanket layer 53 is formed, anisotropic etching is performed on the blanket layer 53 using, for example, reactive ion etching (RIE). During the anisotropic etching process, most of the insulating material is removed from horizontal surfaces, leaving the gate sidewall spacers 55 on the vertical surfaces such as the sidewalls of the sacrificial gate structure 50 and the sidewalls of the exposed fins 30, as shown in FIG. 10A. The mask layer 58 may be exposed from the gate sidewall spacers 55. In some embodiments, isotropic etching may be subsequently performed to remove the insulating material from the upper portions of the S/D region of the exposed fins 30.

Figure 10B:
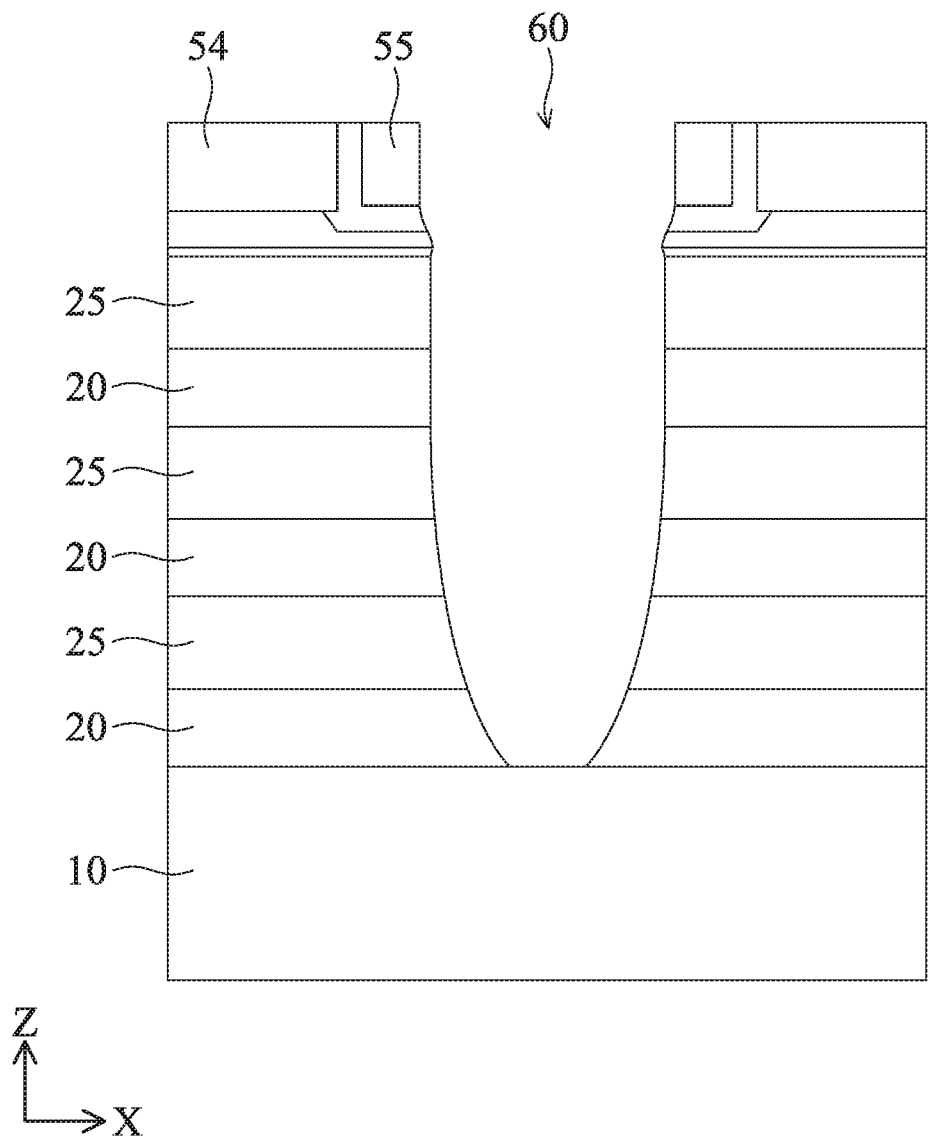
FIGS. 10B, 11, 12, 13, 14, 15, 16, 17, and 18 illustrate cross-sectional views of a semiconductor structure during a fabrication process according to the method of FIGS. 1A and 1B, according to aspects of the present disclosure.

Still referring to FIG. 10A, in conjunction with FIG. 10B, which is the cross sectional view corresponding to area A1 and line X1-X1 of FIG. 10A, method 100 proceeds to operation 114 where the stacked structure of the first semiconductor layers 20 and the second semiconductor layers 25 is etched down at the S/D regions, by using one or more lithography and etching operations, thereby forming an S/D trench 60. In some embodiments, fins 30 in S/D regions are recessed down below the upper surface of the STI 40 by using dry etching and/or wet etching. In the illustrated embodiment, the substrate 10 (or the bottom part 11 of the fin structure) is also partially etched. At this stage, end portions (also referred to as lateral ends) of the stacked layers of the first semiconductor layers 20 and the second semiconductor layers 25 are exposed in the S/D trench 60.

Figure 11:
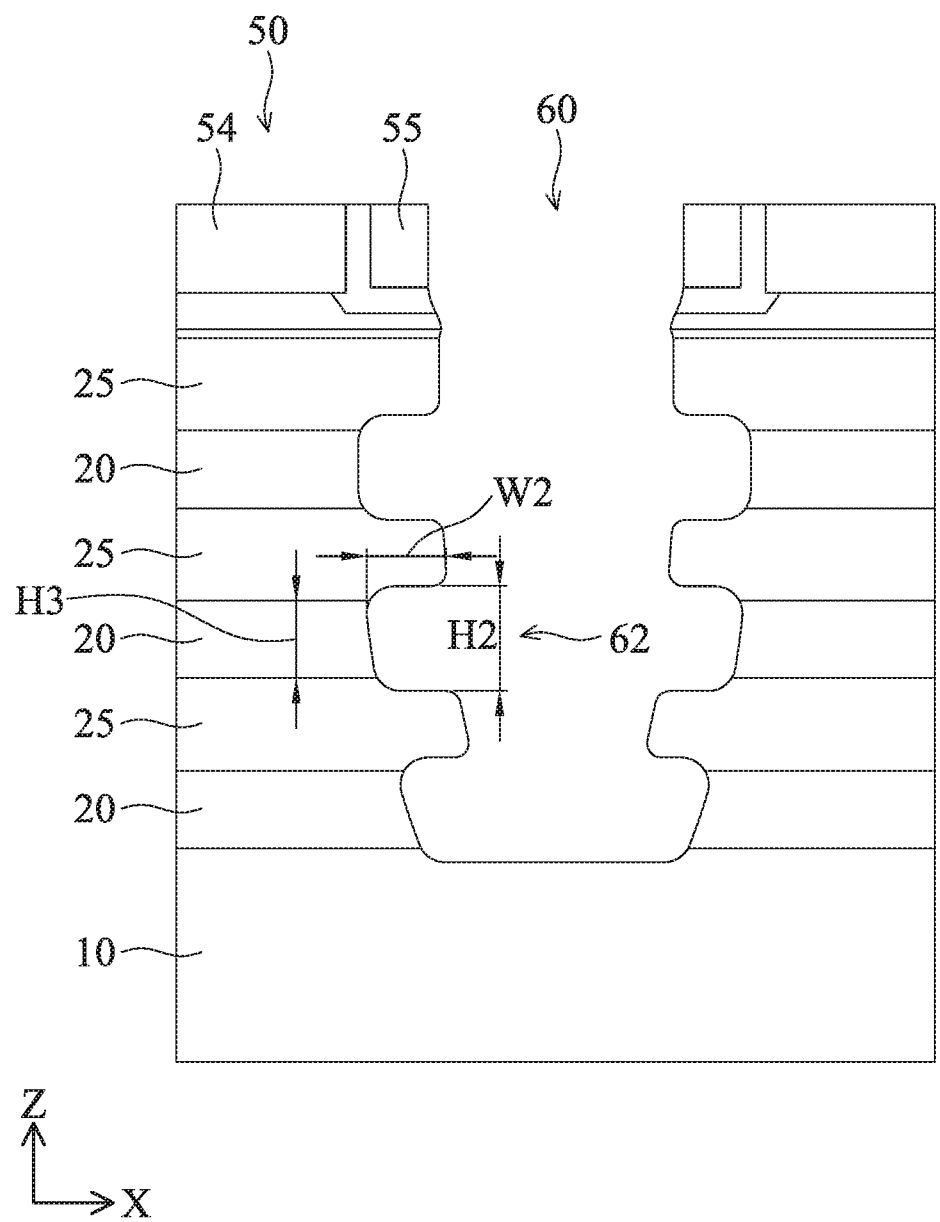

Referring to FIGS. 1A and 11, method 100 proceeds to operation 116 where the first semiconductor layers 20 are laterally etched in the X direction within the S/D trench 60, thereby forming cavities 62. The width W2 of the cavities 62 is in a range from about 3 nm to about 10 nm in some embodiments. When the first semiconductor layers 20 are Ge or SiGe and the second semiconductor layers 25 are Si, the first semiconductor layers 20 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In some embodiments, operation 116 also trims end portions of the second semiconductor layers 25 to reduce a thickness of the end portions of the second semiconductor layers 25 and expand a height H2 of the cavities 62. As will be discussed below, expanding the height H2 of the cavities 62 provides extra space to accommodate a seed layer to be deposited therein. After the trimming, a ratio between the height H2 of the cavities 62 and thickness H3 of the first semiconductor layers 20 may range from about 1.1:1 to about 1.4:1. If the ratio is less than 1.1:1, the seed layer subsequently to be formed in the cavities 62 may not be able to provide sufficient surface area to facilitate epitaxial growth of S/D features. If the ratio is larger than 1.4:1, the end portions of the second semiconductor layers 25 may become too thin, which in turn weakens current driving performance of the GAA FET device. In some embodiments, H2 is in a range from about 6 nm to about 15 nm.

Figure 12:
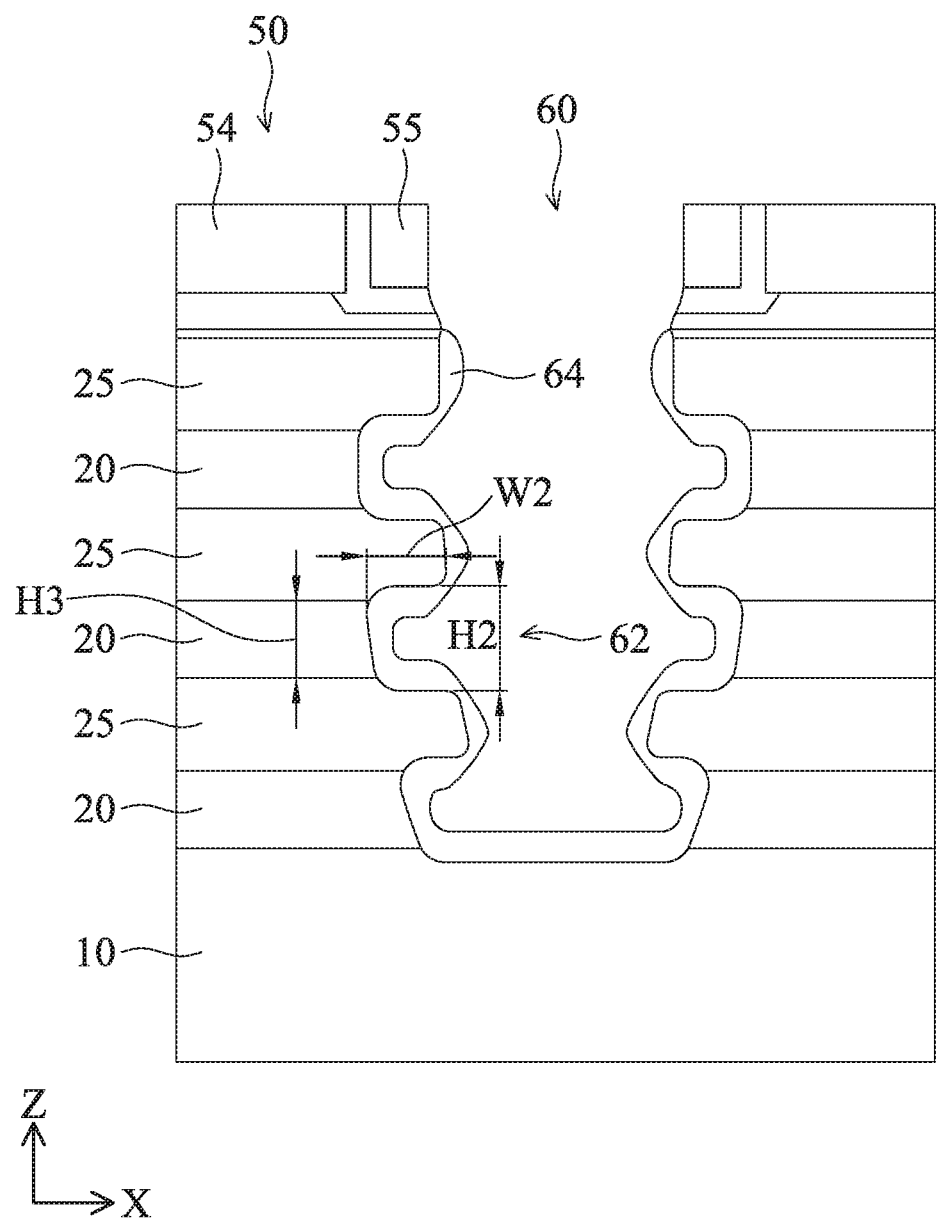

Referring to FIGS. 1A and 12, method 100 proceeds to operation 118 where a first liner layer 64 is formed on the end portions of the first semiconductor layers 20 and the second semiconductor layers 25. By forming the first liner layer 64, the size of cavities 62 is reduced but not completed filled up, due to the cavity height expanding in previous operation 116, which reserves space for the subsequent deposition of a seed layer. The first liner layer 64 also wraps over the end portions of the second semiconductor layers 25. As will be shown in further details below, the first liner layer 64 is etched and formed into inner spacers. Therefore, the first liner layer 64 is also referred to as an inner spacer layer 64. In some embodiments, the first liner layer 64 includes a dielectric material, such as SiN, SiOC, SiOCN, SiCN, $SiO_2$, KN1, and/or other suitable material, such as a low-k dielectric material with a dielectric constant less than about 3.9. In some embodiments, the first liner layer 64 is a semiconductor layer, which may include SiGe or Ge. In various embodiments, an atomic % of Ge in the first liner layer 64 is larger than that in the first semiconductor layer 20. For example, the first semiconductor layers 20 may include $Si_{1-x}Ge_x$, where x is less than about 0.3, such as in a range from about 0.15 to about 0.25; while the first liner layer 64 may include $Si_{1-y}Ge_y$, where y is larger than about 0.3, such as in a range from about 0.35 to about 0.4. The variation of the atomic % of Ge provides a different oxidation rates between the first liner layer 64 and the first semiconductor layer 20, where the benefit will become evident in a later section of the present disclosure. In some embodiments, the first liner layer 64 is conformally epitaxially grown in the S/D trench 60 by ALD or any other suitable method. The first liner layer 64 may have a thickness in a range from about 0.5 nm to about 3.0 nm, such as from about 1.0 nm to about 2.0 nm in some examples.

Figure 13:
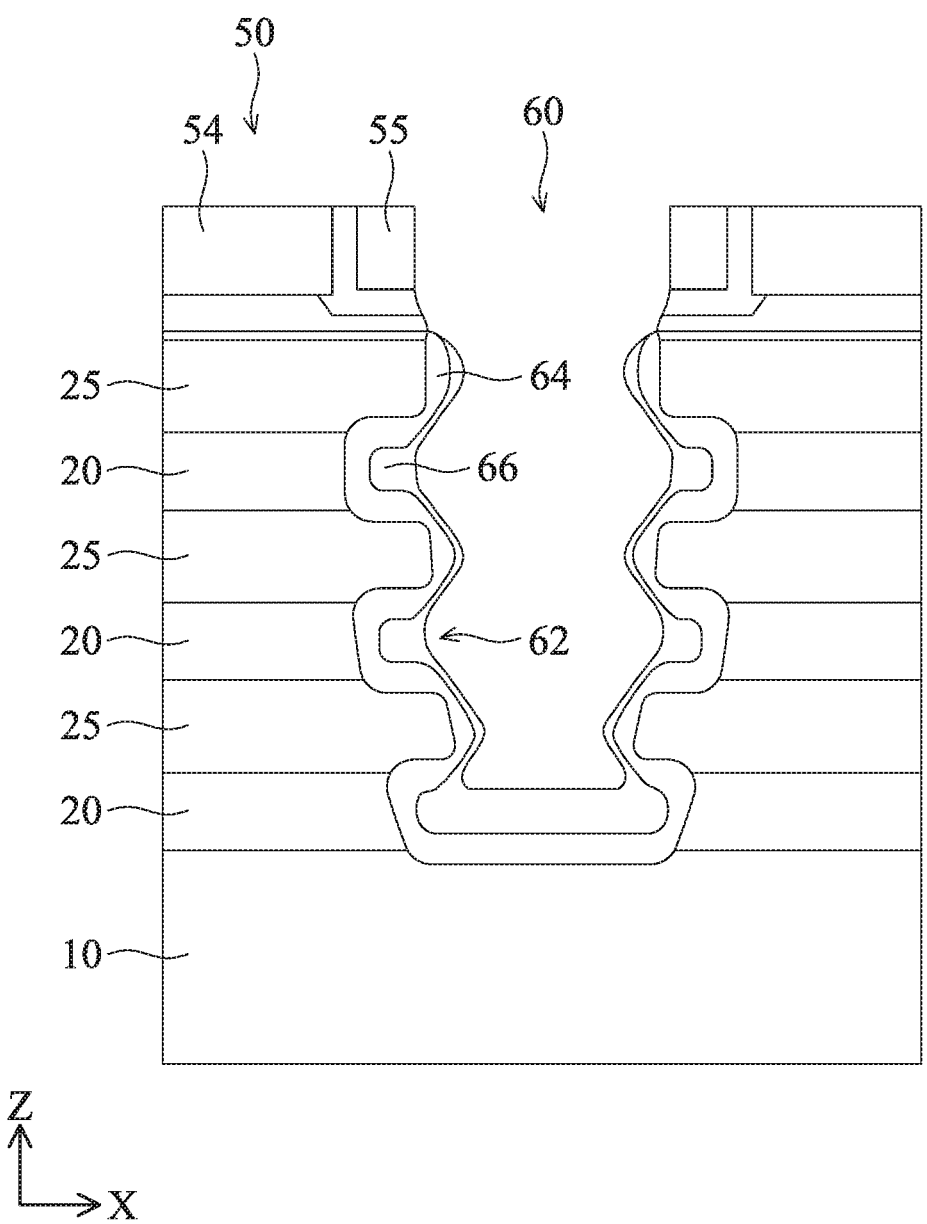

Referring to FIGS. 1B and 13, method 100 proceeds to operation 120 where a second liner layer 66 is formed on the first liner layer 64 in the S/D trench 60. The second liner layer 66 may fill up the cavities 62. In various embodiments, the second liner layer 66 is a semiconductor layer. For example, the second liner layer 66 may be an undoped silicon layer. In some embodiments, the second liner layer 66 includes amorphous silicon. As will be shown in further details below, the second liner layer 66 is etched and formed into seeds to facilitate later-on S/D epitaxial growth. Therefore, the second liner layer 66 is also referred to as a seed layer 66 or a semiconductor seed layer 66. In some embodiments, the second liner layer 66 is conformally epitaxially grown in the S/D trench 60 by ALD or any other suitable method. The second liner layer 66 may have a thickness in a range from about 0.5 nm to about 3.0 nm, such as from about 1.0 nm to about 2.0 nm in some examples.

Figure 14:
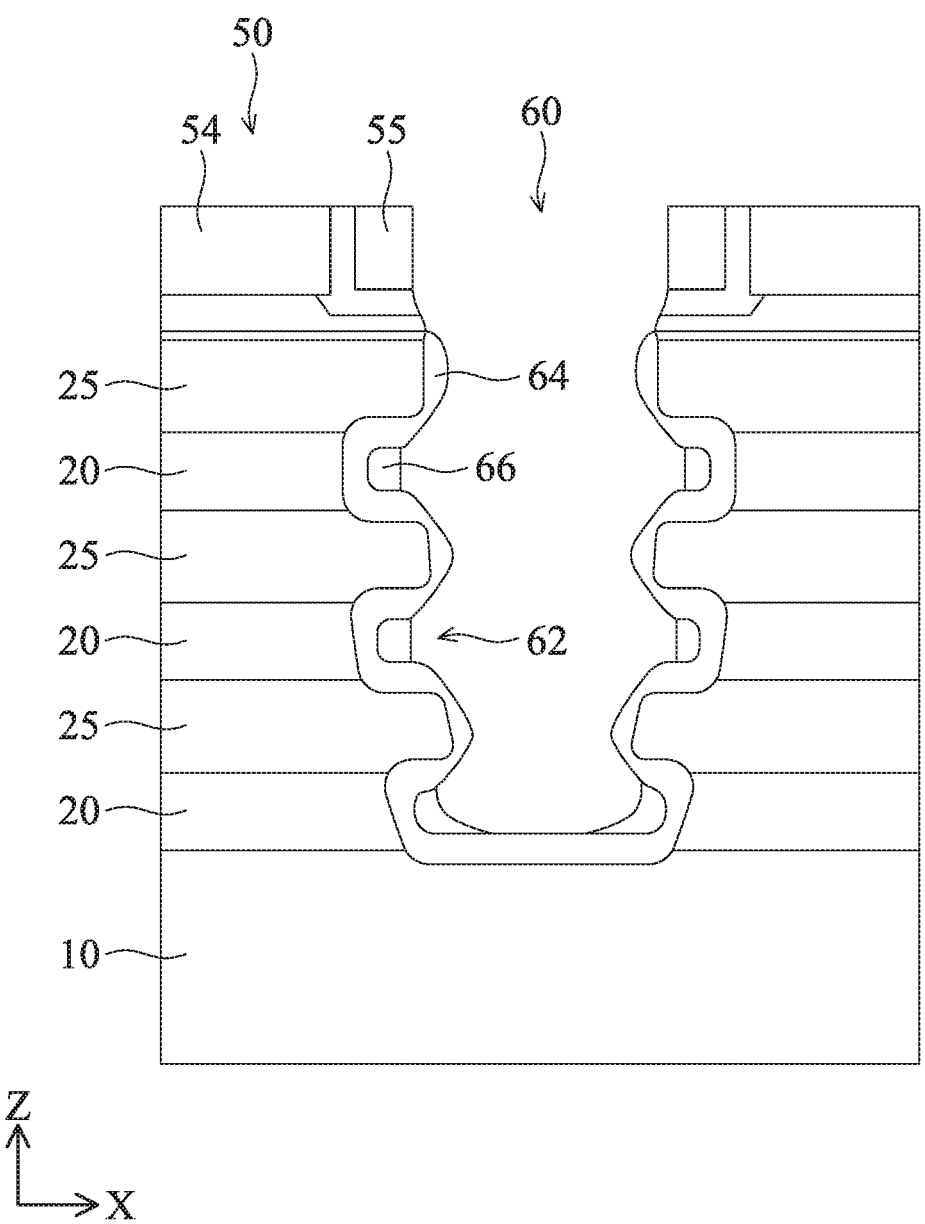
Figure 15:
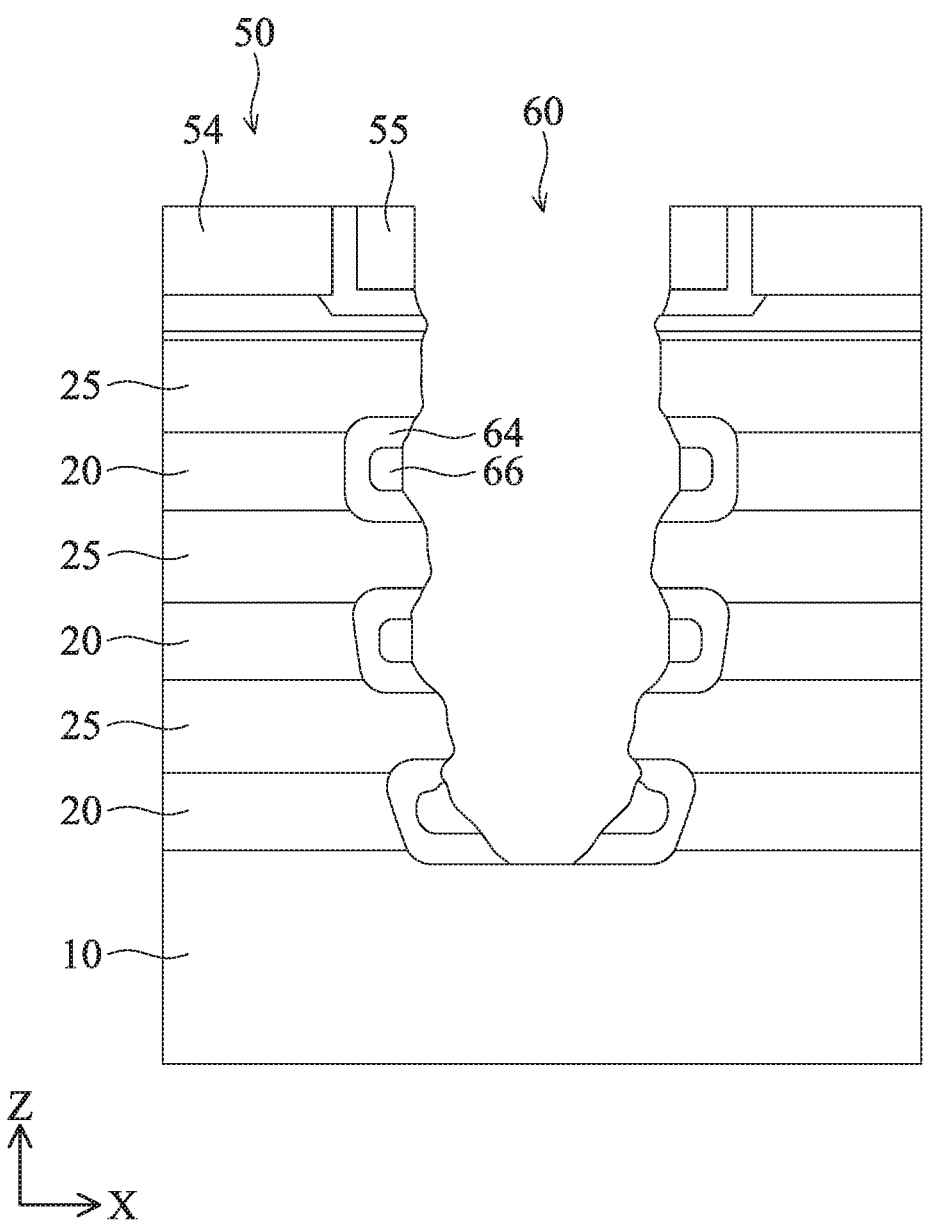

Referring to FIGS. 1B, 14, and 15, method 100 proceeds to operation 122 to partially remove the first liner layer 64 and the second liner layer 66 from the S/D trench 60 to expose end portions of the second semiconductor layers 25. Operation 122 may include an etching process. By this etching, the first liner layer 64 and the second liner layer 66 remain substantially within the cavity 62, because of a small volume of the cavity. Generally, plasma dry etching etches a layer in wide and flat areas faster than a layer in concave (e.g., holes, grooves and/or slits) portions. Thus, the first liner layer 64 and the second liner layer 66 can remain inside the cavities 62. In some embodiments, since the first liner layer 64 and the second liner layer 66 are made of different materials, operation 122 may include more than one etching process with different etchants targeting at different materials. For example, operation 122 first partially removes the second liner layer 66 in a first etching process, while the first liner layer 64 substantially remains on the second semiconductor layers 25, as shown in FIG. 14. Subsequently, operation 122 partially removes the first liner layer 64 in a second etching process to expose lateral ends of the second semiconductor layers 25, as shown in FIG. 15.

Figure 16:
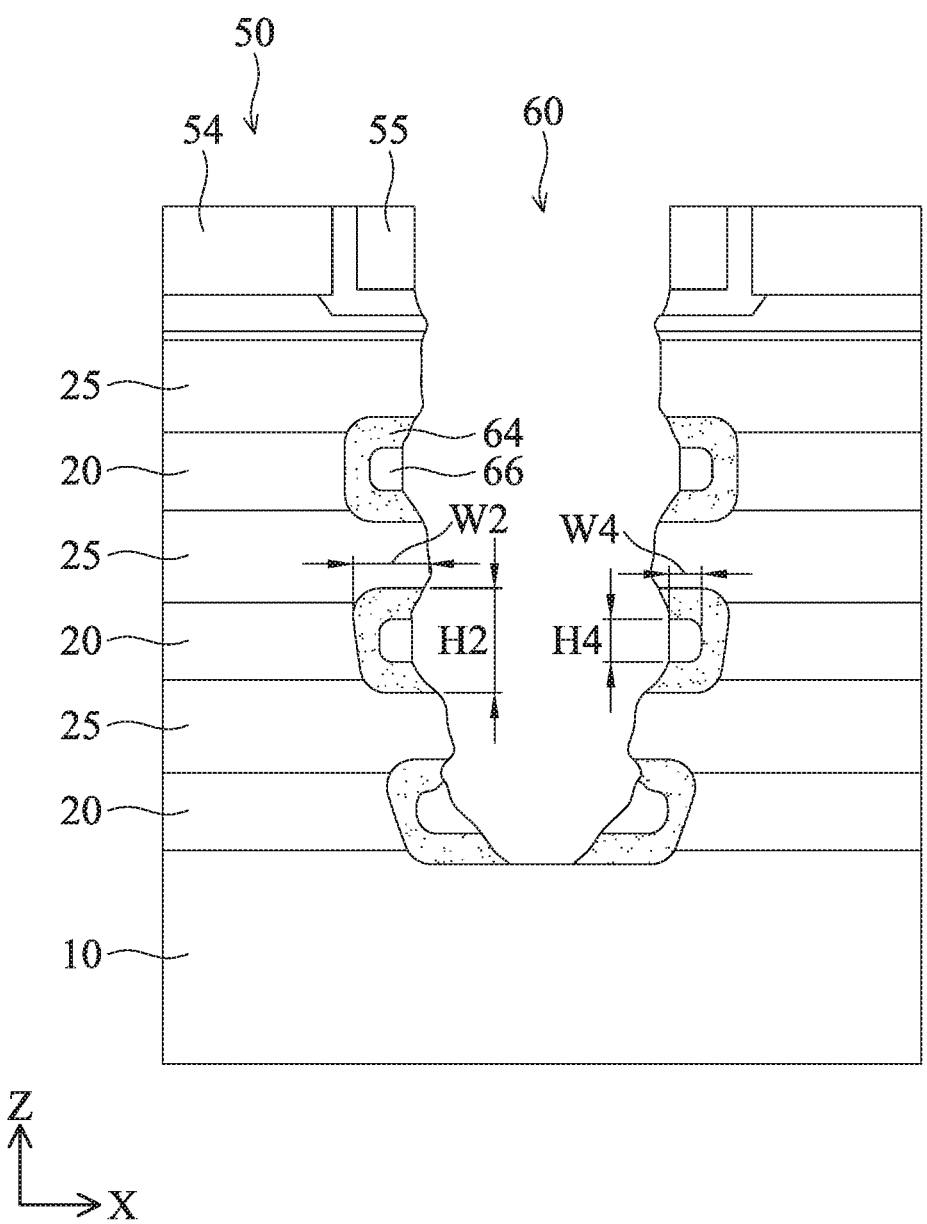

Referring to FIGS. 1B and 16, if the first liner layer 64 is a semiconductor layer (e.g., SiGe or Ge), method 100 may optionally proceed to operation 124 to oxidize the first liner layer 64 into a dielectric oxide layer. In some embodiments, method 100 may proceed to operation 124 prior to operation 122. In some embodiments, the first liner layer 64 is a SiGe or Ge layer with atomic % of Ge larger than that of the other semiconductor layers in the S/D trench 60, such as the second liner layer 66, the first semiconductor layers 20, and the second semiconductor layers 25. For example, the first semiconductor layers 20 may include $Si_{1-x}Ge_x$, where x is less than about 0.3, such as in a range from about 0.15 to about 0.25; while the first liner layer 64 may include $Si_{1-y}Ge_y$, where y is larger than about 0.3, such as in a range from about 0.35 to about 0.4, and the second liner layer 66 and the second semiconductor layer 25 may include Si. The higher atomic % of Ge provides a faster oxidation rates for the first liner layer 64, such that under certain oxidation environment the first liner layer 64 is oxidized while other semiconductor layers in the S/D trench 60 remain substantially unchanged. In the illustrated embodiment, the first liner layer 64 is oxidized by $O_3$ clean and converted to a silicon germanium oxide (SiGeO) layer. Thereafter the second liner layer 66 may have a dielectric constant higher than that of the oxidized first liner layer 64.

After operation 124, the first liner layer 64 is denoted as inner spacer layer 64 and the second liner layer 66 is denoted as seed layer 66 for the sake of clarity and simplicity. As shown in FIG. 16, the inner spacer layer 64 surrounds (or sandwiches) lateral ends of the second semiconductor layers 25 and surrounds (or sandwiches) the seed layer 66. In other words, the seed layer 66 is embedded in the inner spacer layer 64. In various embodiments, the inner spacer layer 64 may have a width W2 ranging from about 3 nm to about 10 nm and a height H2 ranging from about 6 nm to about 15 nm, the seed layer 66 may have a width W4 ranging from about 1 nm to about 3 nm and a height H4 ranging from about 3 nm to about 12 nm. In the illustrated embodiment, the bottom portion of the seed layer 66 (close to the substrate 10) has a larger width than the top portion of the seed layer 66. In the illustrated embodiment, end portions of the inner spacer layer 64 and the seed layer 66 are both under the gate sidewall spacers 55 and offset from sidewalls of the sacrificial gate structure 50. However, depending on depth of the cavities 62 and thickness of the gate sidewall spacers 55, in some embodiments end portions of the inner spacer layer 64 may extend under the sacrificial gate structure 50 (i.e., directly under the sacrificial gate electrode 54) while end portions of the seed layer 66 are offset from sidewalls of the sacrificial gate structure 50; in some alternative embodiments, end portions of the inner spacer layer 64 and the seed layer 66 may both extend under the sacrificial gate structure 50 (i.e., directly under the sacrificial gate electrode 54).

Figure 17:
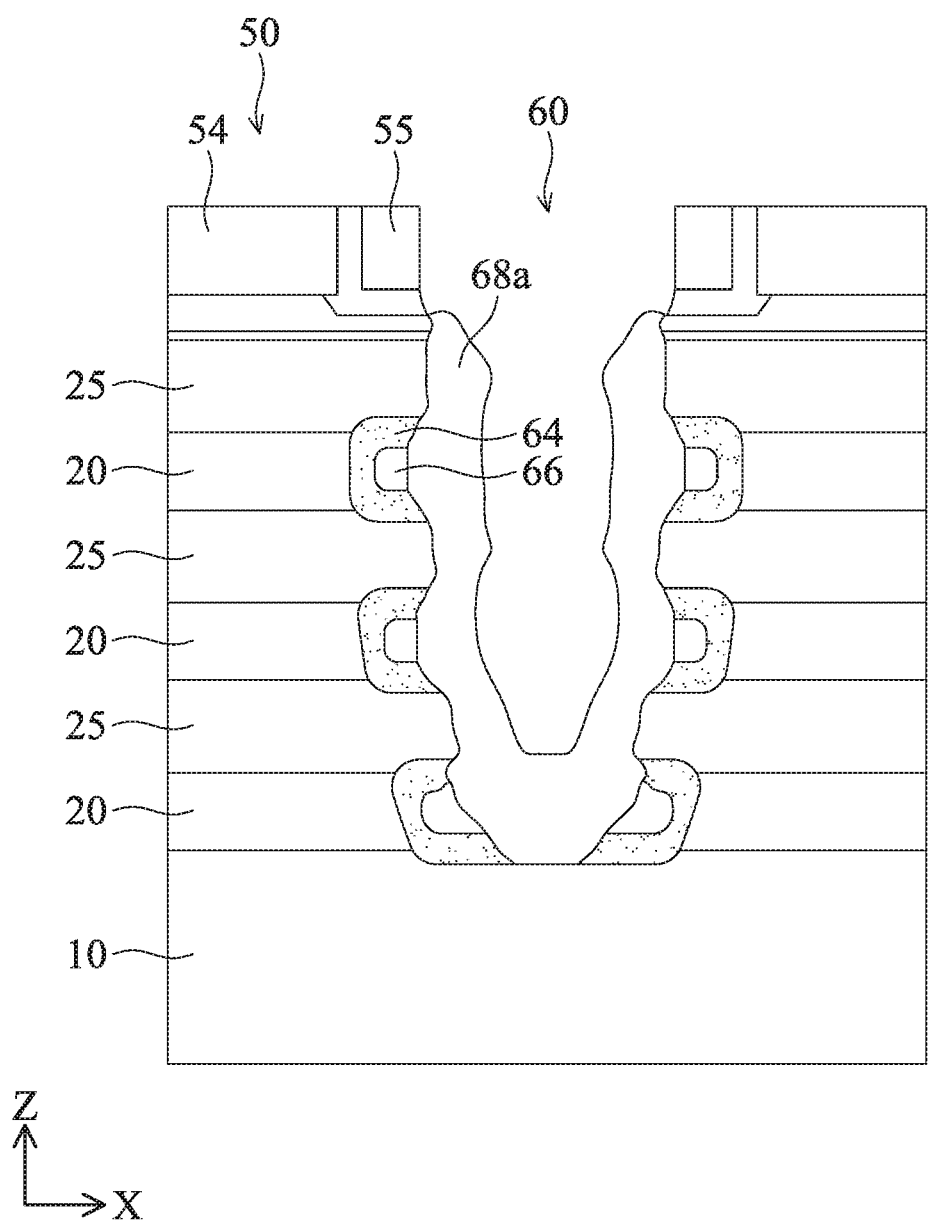
Figure 18:
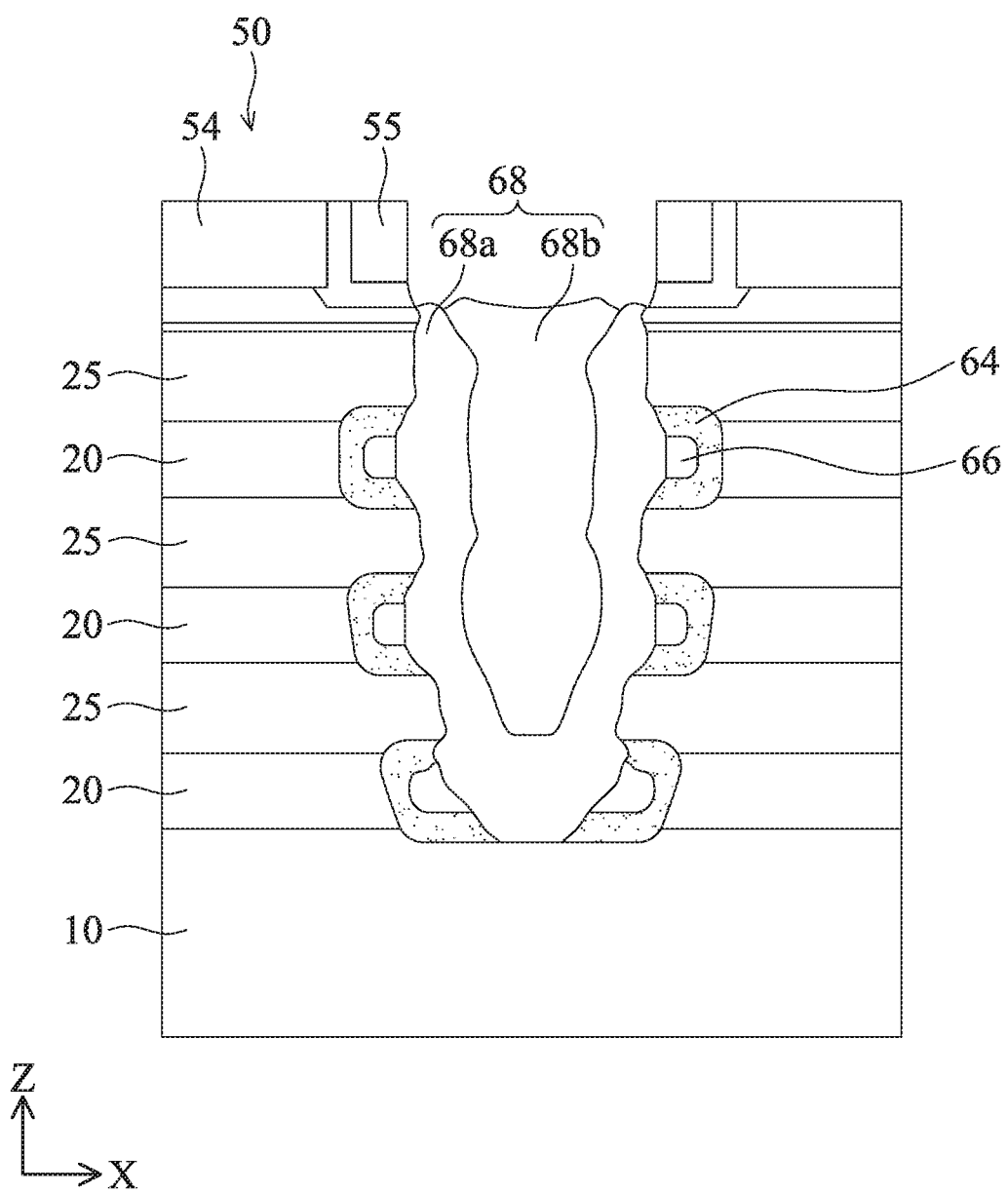

Referring to FIGS. 1B, 17, and 18, method 100 proceeds to operation 126 where an S/D epitaxial feature 68 is formed in the S/D trench 60. In an embodiment, forming the S/D epitaxial feature 68 includes epitaxially growing one or more semiconductor layers (e.g., layers 68a and 68b) by an MBE process, a chemical vapor deposition process, and/or other suitable epitaxial growth processes. In a further embodiment, the S/D epitaxial feature 68 is in-situ or ex-situ doped with an n-type dopant or a p-type dopant. For example, in some embodiments, the S/D epitaxial feature 68 includes silicon-germanium (SiGe) doped with boron for forming S/D features for a p-type FET. In some embodiments, the S/D epitaxial feature 68 includes silicon doped with phosphorous for forming S/D features for an n-type FET. In the illustrated embodiment, operation 126 first deposits semiconductor layer 68a in the S/D trench 60 and then deposits semiconductor layer 68b on the semiconductor layer 68a. In some embodiments, the semiconductor layers 68a and 68b differ in amount of dopant included therein. In some examples, the amount of dopant included in the semiconductor layer 68a is less than that included in the semiconductor layer 68b due to the nature of the doping process. The semiconductor layer 68a is selectively grown on different semiconductor surfaces exposed in the S/D trench 60, such as the top surface of the substrate 10, the lateral ends of the second semiconductor layers 25, as well as sidewalls of the seed layer 66. The seed layer 66 effectively increases available semiconductor surfaces in the S/D trench 60 for the epitaxial growth. Benefiting from a larger epitaxial growing area, the portions of the semiconductor layer 68a grown directly from different semiconductor surfaces merge better and provide a less wavy surface for the subsequent epitaxial growth of the semiconductor layer 68b, where the resultant semiconductor layer 68b grown directly from the semiconductor layer 68a is substantially free of voids.

Figure 19:
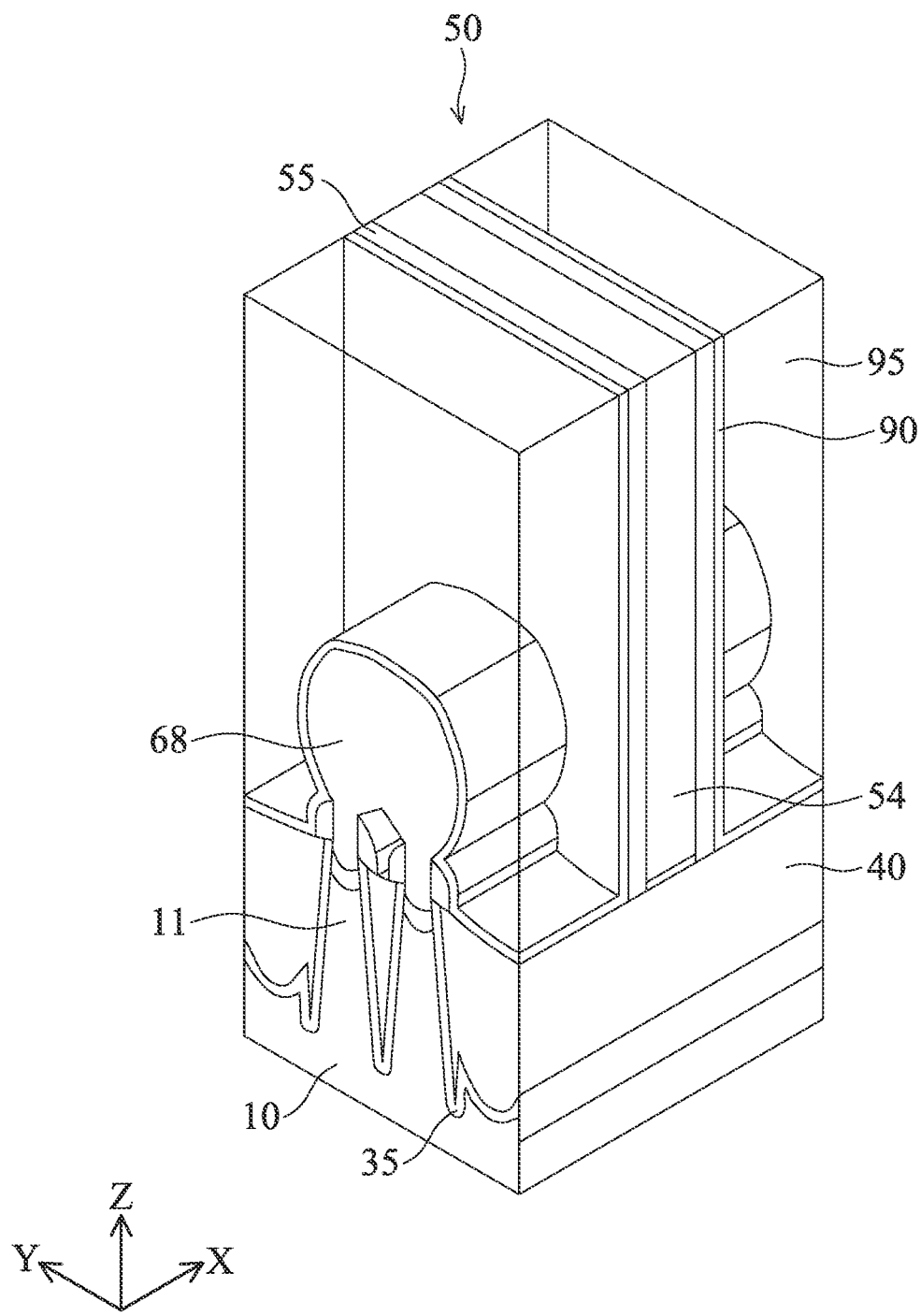

Referring to FIGS. 1B and 19, the method 100 then proceeds to operation 128 where an inter-layer dielectric (ILD) layer 95 is formed on the substrate. In some embodiments, a contact etch stop layer (CESL) 90 is also formed prior to forming the ILD layer 95. In some examples, the CESL 90 includes a silicon nitride layer, silicon oxide layer, a silicon oxynitride layer, and/or other materials known in the art. The CESL 90 may be formed by plasma-enhanced chemical vapor deposition (PECVD) process and/or other suitable deposition or oxidation processes. In some embodiments, the ILD layer 95 includes materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 95 may be deposited by a PECVD process or other suitable deposition technique. In some embodiments, after formation of the ILD layer 95, the semiconductor device as shown in FIG. 19 may be subject to a high thermal budget process to anneal the ILD layer 95. In some examples, after depositing the ILD layer 95, a planarization process may be performed to remove excessive dielectric materials. For example, a planarization process includes a chemical mechanical planarization (CMP) process which removes portions of the ILD layer 95 (and CESL layer, if present) overlying the sacrificial gate structure 50 and exposes the sacrificial gate electrode 54.

Figure 20:
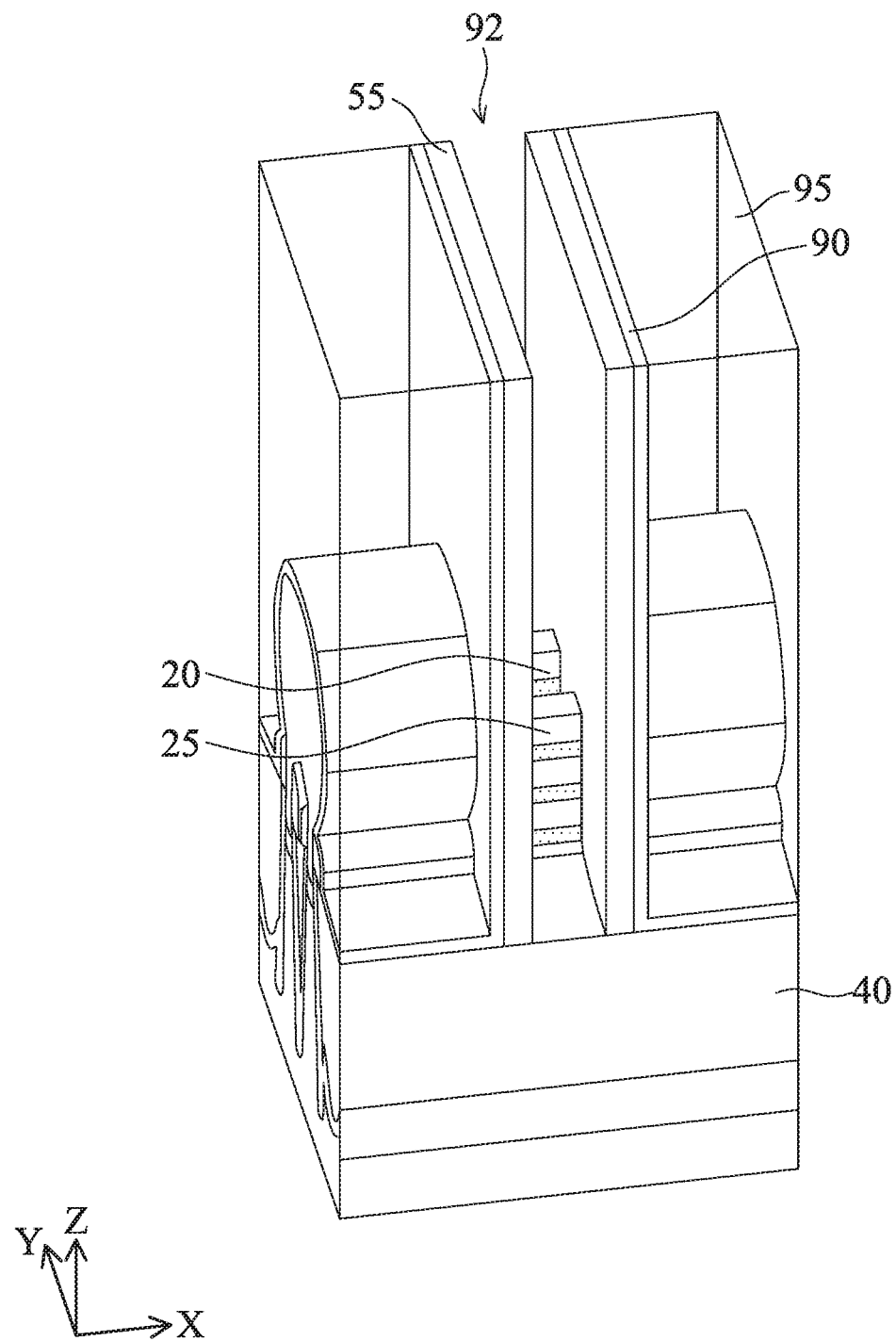

Referring to FIGS. 1B and 20, method 100 then proceeds to operation 130 by removing the sacrificial gate structure 50 to form a gate trench 92 in the channel region. A final gate structure (e.g., including a high-K dielectric layer and metal gate electrode) may be subsequently formed in the gate trench 92, as will be described below. Operation 130 may include one or more etching processes that are selective to the material in the sacrificial gate structure 50. For example, the removal of the sacrificial gate structure 50 may be performed using a selective etch process such as a selective wet etch, a selective dry etch, or a combination thereof. The stacked semiconductor layers 20 and 25 of the fin 30 are exposed in the gate trench 92.

Figure 21:
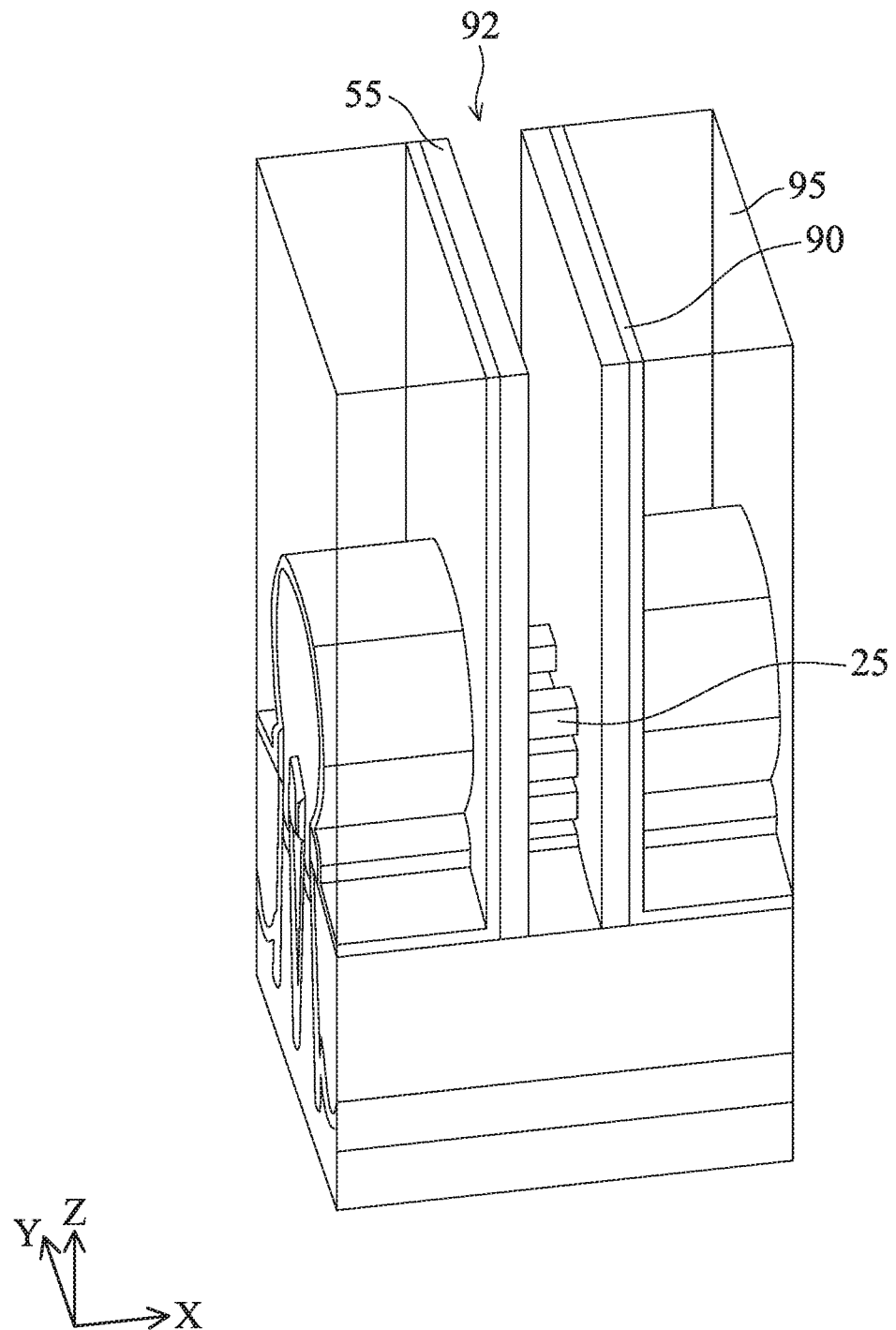

Referring to FIGS. 1B and 21, method 100 then proceeds to operation 132 by removing the first semiconductor layers 20 from the fins 30 in the gate trench 92 thereby forming nanowires of the second semiconductor layers 25. In an embodiment, the first semiconductor layers 20 are removed by a selective wet etching process. In an embodiment, the first semiconductor layers 20 are SiGe and the second semiconductor layers 25 are silicon allowing for the selective removal of the first semiconductor layers 20 using a wet etchant such as, but not limited to, ammonium hydroxide (NH$_4$OH), tetramethylammonium hydroxide (TMAH), ethylenediamine pyrocatechol (EDP), or potassium hydroxide (KOH) solution. In some embodiments, the selective wet etching includes an APM etch (e.g., ammonia hydroxide-hydrogen peroxide-water mixture). In the present embodiment, since the inner spacer layer 64 (e.g., SiGeO) is formed, the etching of the first semiconductor layers 20 (e.g., SiGe) stops at the inner spacer layer 64. Since the etching of the first semiconductor layers 20 stop at the inner spacer layer 64, it is possible to prevent the gate electrode and the S/D epitaxial features from contacting or bridging.

Figure 22:
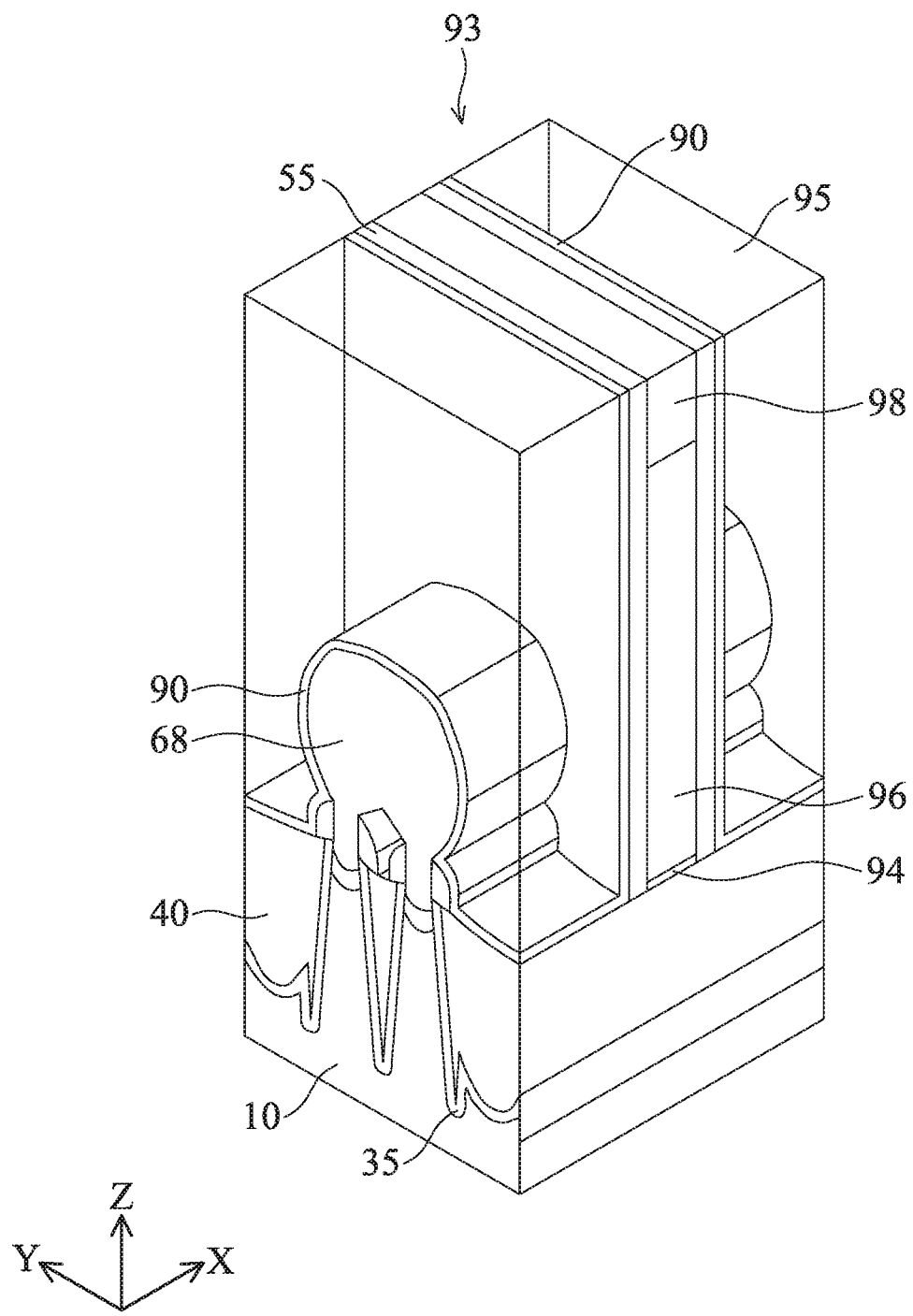

Referring to FIGS. 1B and 22, method 100 then proceeds to operation 134 where a gate structure 93 is formed. The gate structure 93 may be a high-K/metal gate (HK MG) stack, however other compositions are possible. In some embodiments, after the multi-channels provided by the plurality of nanowires (now having gaps therebetween due to the removing of the first semiconductor layers 20) of the second semiconductor layers 25 are formed, a gate dielectric layer 94 is formed around each channel layers (nanowires of the second semiconductor layers 25), and a gate electrode layer 96 is formed on the gate dielectric layer 94.

In certain embodiments, the gate dielectric layer 94 includes one or more layers of a dielectric material, such as silicon oxide, silicon nitride, or high-k dielectric material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof. In some embodiments, the gate dielectric layer 94 includes an interfacial layer formed between the channel layers and the dielectric material. The gate dielectric layer 94 may be formed by CVD, ALD or any suitable method. In one embodiment, the gate dielectric layer 94 is formed using a highly conformal deposition process such as ALD in order to ensure the formation of a gate dielectric layer having a uniform thickness around each channel layers. The thickness of the gate dielectric layer 94 is in a range from about 1 nm to about 6 nm in one embodiment.

The gate electrode 96 is formed on the gate dielectric layer 94 to surround each channel layers. The gate electrode 96 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode 96 may be formed by CVD, ALD, electro-plating, or other suitable method. The gate electrode 96 is also deposited over the upper surface of the ILD layer 95. The gate dielectric layer and the gate electrode layer formed over the ILD layer 95 are then planarized by using, for example, CMP, until the top surface of the ILD layer 95 is revealed.

After the planarization operation, the gate electrode 96 is recessed and a cap insulating layer 98 is formed over the recessed gate electrode 96. The cap insulating layer 98 includes one or more layers of a silicon nitride-based material, such as SiN. The cap insulating layer 98 can be formed by depositing an insulating material followed by a planarization operation.

In certain embodiments of the present disclosure, one or more work function adjustment layers (not shown) are interposed between the gate dielectric layer 94 and the gate electrode 96. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

The semiconductor device as shown in FIG. 22 may undergo further processing to form various features and regions known in the art. For example, subsequent processing may form contact openings, contact metal, as well as various contacts/vias/lines and multilayers interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Although not intended to be limiting, one or more embodiments of the present disclosure provide many benefits to a semiconductor device and the formation thereof. For example, embodiments of the present disclosure provide a seed layer embedded in an inner spacer layer so as to provide larger semiconductor surface area in a S/D trench to facilitate S/D epitaxial growth, which in turn improves qualities of the S/D epitaxial features. The inner spacer layer also provides isolation between S/D regions and the gate stack. Furthermore, the inner spacer layer and the seed layer formation method can be easily integrated into existing semiconductor fabrication processes.

In one exemplary aspect, the present disclosure is directed to a method of manufacturing a semiconductor device. The method includes forming a fin structure in which first semiconductor layers and second semiconductor layers are alternately stacked; forming a sacrificial gate structure over the fin structure; etching a source/drain region of the fin structure, which is not covered by the sacrificial gate structure, thereby forming a source/drain trench; laterally etching the first semiconductor layers through the source/drain trench; forming an inner spacer layer, in the source/drain trench, at least on lateral ends of the etched first semiconductor layers; forming a seeding layer on the inner spacer layer; and growing a source/drain epitaxial layer in the source/drain trench, wherein the growing of the source/drain epitaxial layer includes growing the source/drain epitaxial layer from the seeding layer. In some embodiments, the seeding layer is partially embedded in the inner spacer layer. In some embodiments, the forming of the inner spacer layer includes depositing the inner spacer layer in the source/drain trench, thereby covering lateral ends of the second semiconductor layers; and partially removing the inner spacer layer to expose the lateral ends of the second semiconductor layers. In some embodiments, the forming of the seeding layer includes epitaxially growing the seeding layer on the inner spacer layer, wherein the seeding layer covers lateral ends of the second semiconductor layers; and partially removing the seeding layer from the lateral ends of the second semiconductor layers. In some embodiments, the method further includes after the forming of the seeding layer, oxidizing the inner spacer layer. In some embodiments, the growing of the source/drain epitaxial layer includes growing a first epitaxial layer directly from the seeding layer; and growing a second epitaxial layer directly from the first epitaxial layer, wherein the second epitaxial layer has a higher dopant concentration than that of the first epitaxial layer. In some embodiments, the inner spacer layer includes germanium. In some embodiments, the seeding layer includes undoped silicon. In some embodiments, the seeding layer includes amorphous silicon. In some embodiments, the method further includes removing the sacrificial gate structure, thereby forming a gate trench; removing the first semiconductor layers from the gate trench, thereby exposing the second semiconductor layers in the gate trench; and forming a metal gate structure engaging the exposed second semiconductor layers.

In another exemplary aspect, the present disclosure is directed to a method of manufacturing a semiconductor device. The method includes forming a fin extruding from a substrate, the fin having a plurality of sacrificial layers and a plurality of channel layers, wherein the sacrificial layers and the channel layers are alternately arranged; removing the sacrificial layers and the channel layers from a source/drain region of the fin, thereby forming a source/drain trench; depositing a first semiconductor layer in the source/drain trench; depositing a second semiconductor layer on the first semiconductor layer; partially removing the first semiconductor layer and the second semiconductor layer to expose the channel layers in the source/drain trench; oxidizing the first semiconductor layer; and epitaxially growing a source/drain feature from the second semiconductor layer. In some embodiments, the second semiconductor layer has a dielectric constant higher than that of the oxidized first semiconductor layer. In some embodiments, the first semiconductor layer includes silicon germanium and the second semiconductor layer includes silicon. In some embodiments, after the partially removing of the first semiconductor layer and the second semiconductor layer, remaining portions of the second semiconductor layer are surrounded by the first semiconductor layer. In some embodiments, the depositing of the first semiconductor layer and the depositing of the second semiconductor layer both include an epitaxial growing process. In some embodiments, the method further includes removing the sacrificial layers from a channel region of the fin, thereby forming a gate trench; and forming a gate structure engaging the channel layers in the gate trench.

In yet another exemplary aspect, the present disclosure is directed to a multi-gate semiconductor device. The multi-gate semiconductor device includes channel members disposed over a substrate; a gate structure engaging the channel members; a source/drain epitaxial feature adjacent the channel members; an inner spacer layer interposing the gate structure and the source/drain epitaxial feature; and a semiconductor layer interposing the inner spacer layer and the source/drain epitaxial feature. In some embodiments, the semiconductor layer is embedded in the inner spacer layer. In some embodiments, the semiconductor layer is in physical contact with the source/drain epitaxial feature. In some embodiments, the inner spacer layer surrounds lateral ends of the channel members, and wherein the lateral ends of the channel members have a thickness smaller than center portions of the channel members.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a fin structure in which first semiconductor layers and second semiconductor layers are alternately stacked;
    forming a sacrificial gate structure over the fin structure;
    etching a source/drain region of the fin structure, which is not covered by the sacrificial gate structure, thereby forming a source/drain trench;
    laterally etching the first semiconductor layers through the source/drain trench;
    forming an inner spacer layer, in the source/drain trench, at least on lateral ends of the etched first semiconductor layers;
    forming a seeding layer on the inner spacer layer; and
    growing a source/drain epitaxial layer in the source/drain trench, wherein the growing of the source/drain epitaxial layer includes growing the source/drain epitaxial layer from the seeding layer and from lateral ends of the second semiconductor layers.

2. The method of claim 1, wherein the seeding layer is partially embedded in the inner spacer layer.

3. The method of claim 1, wherein the forming of the inner spacer layer includes:
    depositing the inner spacer layer in the source/drain trench, thereby covering lateral ends of the second semiconductor layers; and
    partially removing the inner spacer layer to expose the lateral ends of the second semiconductor layers.

4. The method of claim 1, wherein the forming of the seeding layer includes:
    epitaxially growing the seeding layer on the inner spacer layer, wherein the seeding layer covers lateral ends of the second semiconductor layers; and partially removing the seeding layer from the lateral ends of the second semiconductor layers.

5. The method of claim 1, further comprising:
after the forming of the seeding layer, oxidizing the inner spacer layer.

6. The method of claim 1, wherein the growing of the source/drain epitaxial layer includes:
growing a first epitaxial layer directly from the seeding layer; and
growing a second epitaxial layer directly from the first epitaxial layer, wherein the second epitaxial layer has a higher dopant concentration than that of the first epitaxial layer.

7. The method of claim 1, wherein the inner spacer layer includes germanium.

8. The method of claim 1, wherein the seeding layer includes undoped silicon.

9. The method of claim 1, wherein the seeding layer includes amorphous silicon.

10. The method of claim 1, further comprising:
removing the sacrificial gate structure, thereby forming a gate trench;
removing the first semiconductor layers from the gate trench, thereby exposing the second semiconductor layers in the gate trench; and
forming a metal gate structure engaging the exposed second semiconductor layers.

11. A method of manufacturing a semiconductor device, comprising:
forming a fin extruding from a substrate, the fin having a plurality of sacrificial layers and a plurality of channel layers, wherein the sacrificial layers and the channel layers are alternately arranged;
removing the sacrificial layers and the channel layers from a source/drain region of the fin, thereby forming a source/drain trench;
depositing a first semiconductor layer in the source/drain trench;
depositing a second semiconductor layer on the first semiconductor layer;
partially removing the first semiconductor layer and the second semiconductor layer to expose the channel layers in the source/drain trench;
oxidizing the first semiconductor layer; and
epitaxially growing a source/drain feature from the second semiconductor layer.

12. The method of claim 11, wherein the second semiconductor layer has a dielectric constant higher than that of the oxidized first semiconductor layer.

13. The method of claim 11, wherein the first semiconductor layer includes silicon germanium and the second semiconductor layer includes silicon.

14. The method of claim 11, wherein after the partially removing of the first semiconductor layer and the second semiconductor layer, remaining portions of the second semiconductor layer are surrounded by the first semiconductor layer.

15. The method of claim 11, wherein the depositing of the first semiconductor layer and the depositing of the second semiconductor layer both include an epitaxial growing process.

16. The method of claim 11, further comprising:
removing the sacrificial layers from a channel region of the fin, thereby forming a gate trench; and
forming a gate structure engaging the channel layers in the gate trench.

17. A method of manufacturing a semiconductor device, comprising:
forming a stack of alternately vertically arranged first semiconductor layers and second semiconductor layers;
patterning the stack in forming a fin;
etching a portion of the fin in forming a trench;
depositing a spacer layer on sidewalls of the trench;
depositing a semiconductive material layer covering the spacer layer in the trench;
partially removing the semiconductive material layer from portions of the spacer layer that are deposited on lateral ends of the second semiconductor layers;
etching the portions of the spacer layer and exposing the lateral ends of the second semiconductor layers; and
growing an epitaxial feature in the trench, wherein the growing of the epitaxial layer includes directly growing the epitaxial layer from remaining portions of the semiconductive material layer.

18. The method of claim 17, wherein the remaining portions of the semiconductive material layer are partially embedded in the spacer layer.

19. The method of claim 17, further comprising:
after the partially removing of the semiconductive material layer, oxidizing the spacer layer.

20. The method of claim 19, wherein the oxidized spacer layer includes silicon germanium oxide.

* * * * *